(12) United States Patent
Moriya et al.

(10) Patent No.: US 8,198,613 B2
(45) Date of Patent: *Jun. 12, 2012

(54) MIRROR FOR EXTREME ULTRA VIOLET, MANUFACTURING METHOD FOR MIRROR FOR EXTREME ULTRA VIOLET, AND FAR ULTRAVIOLET LIGHT SOURCE DEVICE

(75) Inventors: Masato Moriya, Hiratsuka (JP); Osamu Wakabayashi, Hiratsuka (JP); Georg Soumagne, Hiratsuka (JP)

(73) Assignees: Komatsu Ltd., Tokyo (JP); Gigaphoton, Inc., Tokyo (JP)

( * ) Notice: Subject to any disclaimer, the term of this patent is extended or adjusted under 35 U.S.C. 154(b) by 190 days.

This patent is subject to a terminal disclaimer.

(21) Appl. No.: 12/469,140

(22) Filed: May 20, 2009

(65) Prior Publication Data

US 2009/0289205 A1 Nov. 26, 2009

(30) Foreign Application Priority Data

May 20, 2008 (JP) ................................. 2008-132479
Aug. 21, 2008 (JP) ................................. 2008-212787

(51) Int. Cl.
*G21K 5/04* (2006.01)
*G21K 1/06* (2006.01)

(52) U.S. Cl. .............. 250/504 R; 250/493.1; 250/503.1; 359/350; 359/355; 359/359; 359/361

(58) Field of Classification Search ............... 250/493.1, 250/494.1, 503.1, 504 R; 359/350, 355, 359/359, 361
See application file for complete search history.

(56) References Cited

U.S. PATENT DOCUMENTS 6,398,374 B1 * 6/2002 Chapman et al. ............. 359/857
(Continued)

FOREIGN PATENT DOCUMENTS
JP 2005-064135 A 3/2005
(Continued)

OTHER PUBLICATIONS

H. Kierey, et al., "EUV spectral purity filter: optical and mechanical design, grating fabrication, and testing," "Advances in Mirror Technology for X-Ray, EUV Lithography, Laser and Other Applications," edited by Ali M. Khounsary, et al., Proceedings of SPIE, vol. 5193. (Discussed on p. 5 of the Specification).

(Continued)

*Primary Examiner* — David A Vanore
*Assistant Examiner* — Nicole Ippolito
(74) *Attorney, Agent, or Firm* — McDermott Will & Emery LLP

(57) ABSTRACT

The EUV light source device eliminates radiation other than EUV radiation from the light which it emits, and supplies only the EUV radiation to an exposure device. A composite layer consisting of a plurality of Mo/Si pair layers is provided upon the front surface of an EUV collector mirror, and blazed grooves are formed in this composite layer. Radiation emitted from a plasma is incident upon this EUV collector mirror, and is reflected or diffracted. The reflected EUV radiation (including diffracted EUV) proceeds towards an intermediate focal point IF. The radiation of other wavelengths proceeds towards some position other than this focal point IF, because its reflection angle or diffraction angle is different. A SPF shield having an aperture portion is provided at the focal point IF. Accordingly, only the EUV radiation passes through the aperture portion and is supplied to the exposure device, while the other radiation is intercepted by the shield.

55 Claims, 18 Drawing Sheets

U.S. PATENT DOCUMENTS

| | | | |
|---|---|---|---|
| 6,440,277 B1* | 8/2002 | D'Amato | 204/192.15 |
| 6,469,827 B1 | 10/2002 | Sweatt et al. | |
| 6,809,327 B2 | 10/2004 | Bristol | |
| 7,050,237 B2 | 5/2006 | Chapman | |
| 2003/0072412 A1 | 4/2003 | Martynov et al. | |
| 2004/0109149 A1* | 6/2004 | Elp et al. | 355/67 |
| 2005/0024614 A1* | 2/2005 | Bakker | 355/67 |
| 2005/0122589 A1* | 6/2005 | Bakker | 359/591 |
| 2005/0230645 A1* | 10/2005 | Melnychuk et al. | 250/504 R |
| 2005/0264789 A1* | 12/2005 | Komatsuda | 355/67 |
| 2006/0215137 A1* | 9/2006 | Hasegawa et al. | 355/53 |
| 2006/0227826 A1* | 10/2006 | Balogh et al. | 372/34 |
| 2007/0114468 A1* | 5/2007 | Partlo et al. | 250/504 R |
| 2007/0290279 A1* | 12/2007 | Imamizu | 257/411 |
| 2009/0095925 A1* | 4/2009 | Ershov et al. | 250/504 R |
| 2009/0224182 A1* | 9/2009 | McGeoch | 250/504 R |
| 2009/0267003 A1* | 10/2009 | Moriya et al. | 250/492.22 |
| 2010/0196827 A1* | 8/2010 | Leenders et al. | 430/306 |

FOREIGN PATENT DOCUMENTS

JP          2006-80255 A      3/2006

OTHER PUBLICATIONS

H. Kierey, et al., "EUV spectral purity filter: optical and mechanical design, grating fabrication, and testing," *Advances in Mirror Technology for X-Ray, EUV Lithography, Laser and Other Applications,* (Jan. 13, 2004) edited by Ali M. Khounsary, et al., Proceedings of SPIE, vol. 5193, pp. 70-78, (discussed on p. 5 of specification).

U.S. Appl. No. 12/469,176, filed May 20, 2009, Moriya et al.

United States Office Action issued in U.S. Appl. No. 12/469,176 dated Dec. 2, 2011.

Office Action issued in U.S. Appl. No. 12/469,176, dated Oct. 3, 2011.

Interview Summary issued in U.S. Appl. No. 12/469,176, dated Sep. 20, 2011.

\* cited by examiner

FIG.8
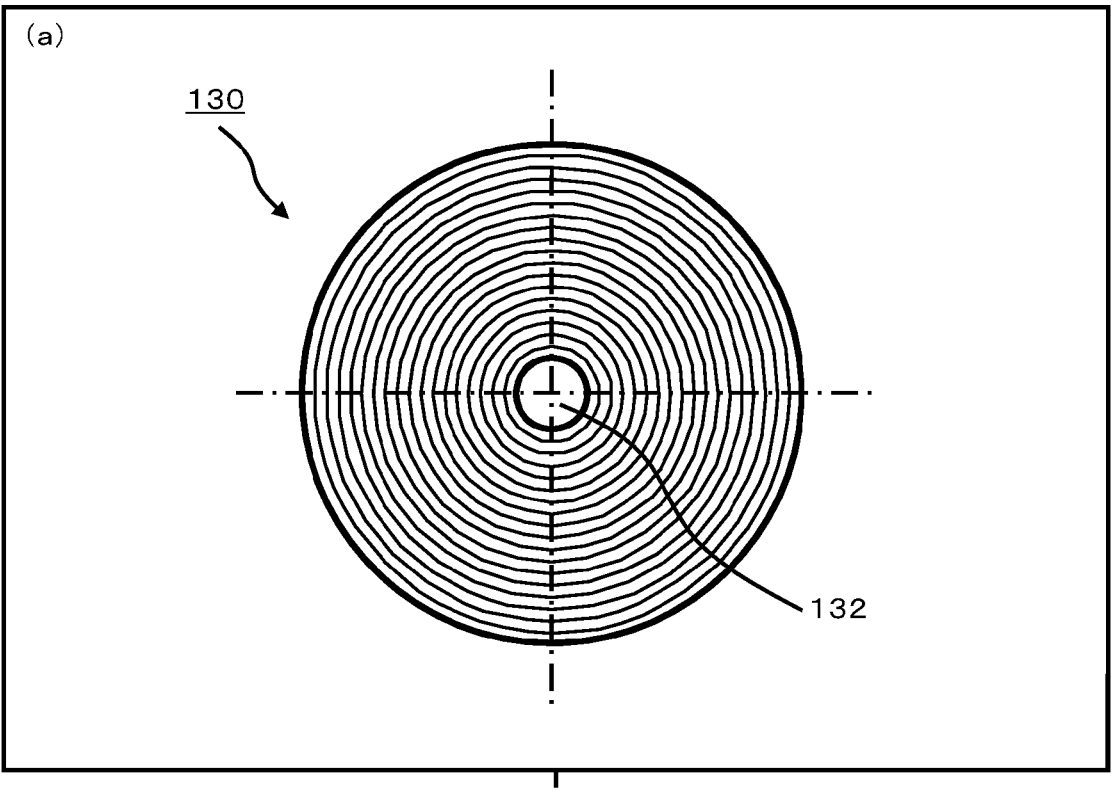
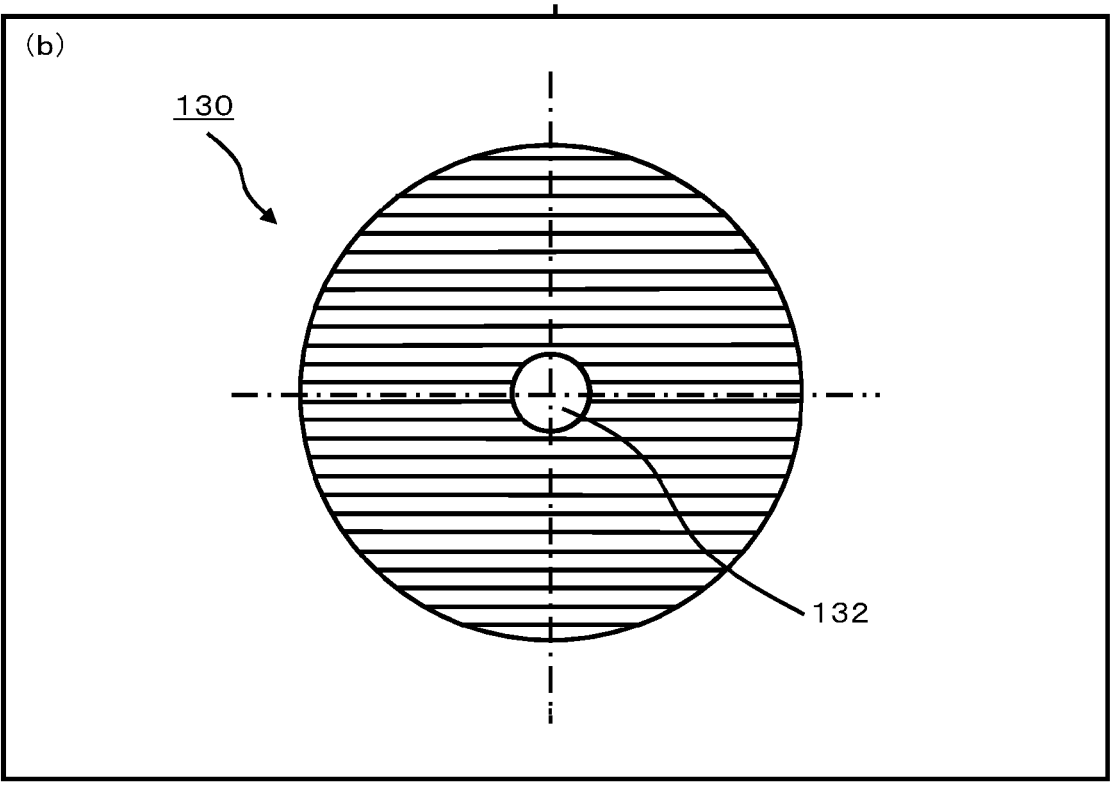

FIG. 12
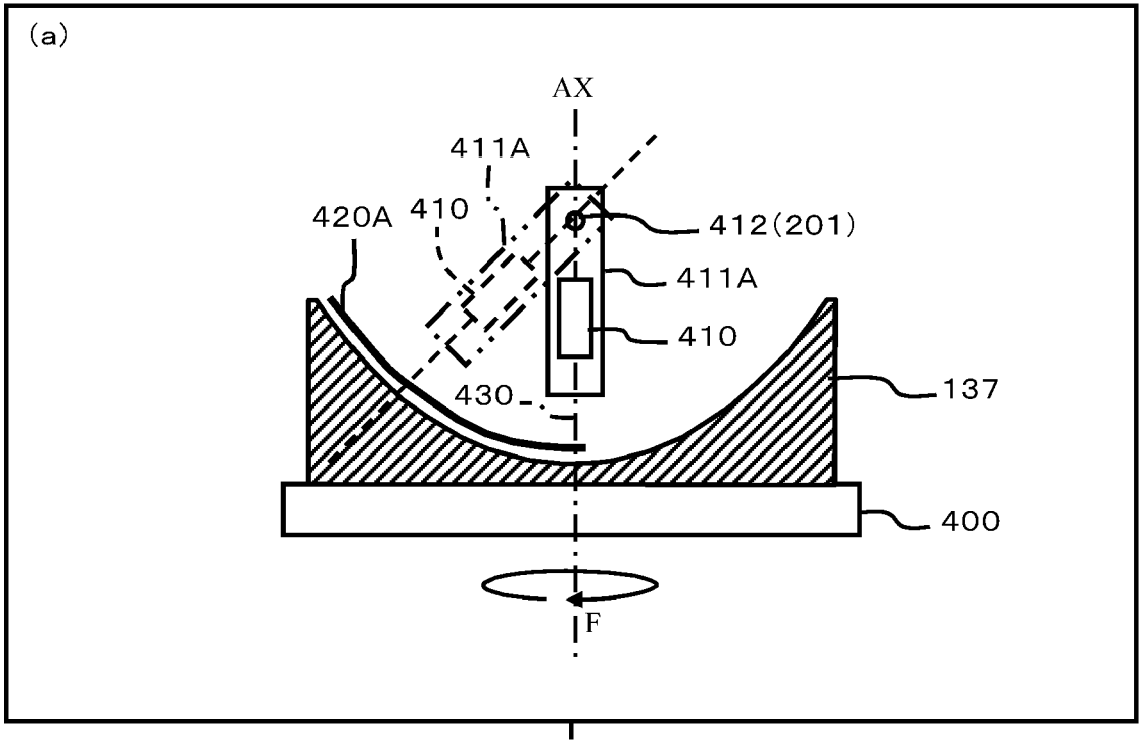
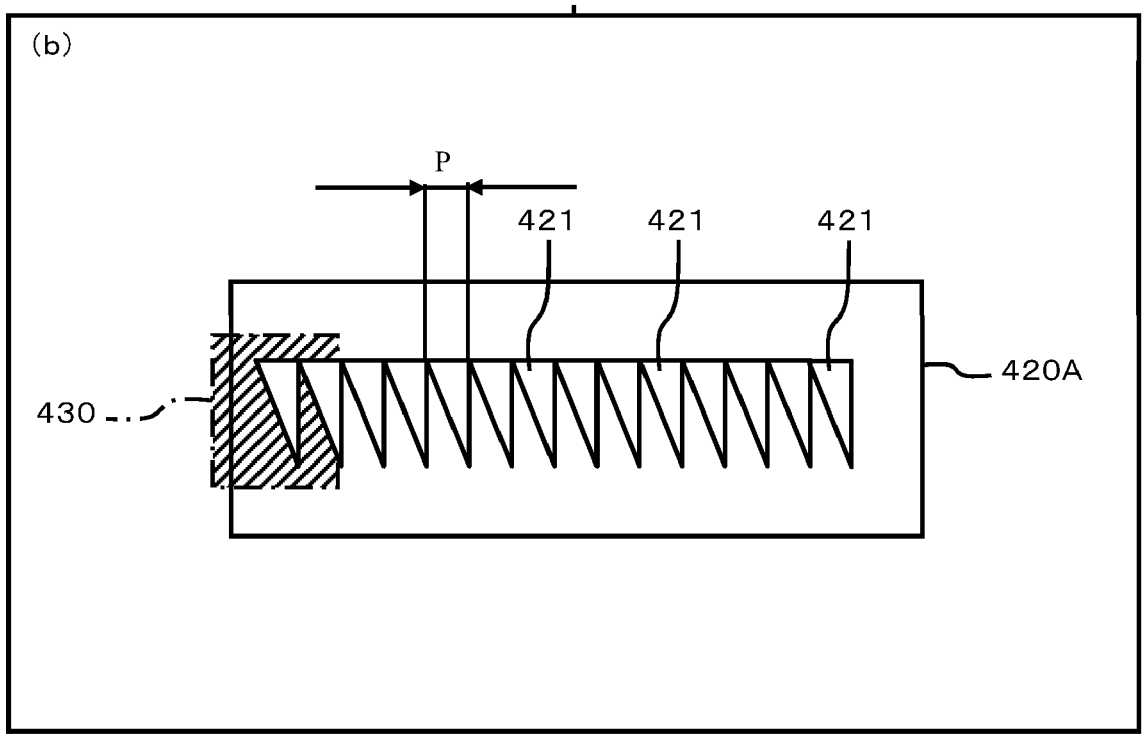

MIRROR FOR EXTREME ULTRA VIOLET, MANUFACTURING METHOD FOR MIRROR FOR EXTREME ULTRA VIOLET, AND FAR ULTRAVIOLET LIGHT SOURCE DEVICE

CROSS REFERENCE TO RELATED APPLICATIONS

The present application is based on and claims priority to Japanese Patent Application No. 2008-132479 and 2008-212787 filed on May 20, 2008, and Aug. 21, 2008, the contents of which are incorporated in their entirety herein by reference. This application is also related to U.S. application Ser. No. 12/469,176, entitled "SEMICONDUCTOR EXPOSURE DEVICE USING EXTREME ULTRA VIOLET RADIATION," filed simultaneously on May 20, 2009 with the present application.

BACKGROUND OF THE INVENTION

Technical Field

The present invention relates to a mirror for reflecting extreme ultra violet, to a method for manufacturing a mirror for extreme ultra violet, and to a far ultraviolet light source device which incorporates a mirror for extreme ultra violet.

For example, a semiconductor chip may be created by projecting a mask upon which a circuit pattern is drawn, in reduced form, upon a wafer to which a resist has been applied, and by repeatedly performing processing such as etching and thin layer formation and so on. Along with the progressive reduction of the scale of semiconductor processing, the use of radiation of progressively shorter and shorter wavelengths is required.

Thus, research is being performed into a semiconductor exposure technique which uses radiation of extremely short wavelength, such as 13.5 nm, and a reducing optical system. This type of technique is termed EUV-L (Extreme Ultra Violet Lithography: exposure using extreme ultra violet). Hereinafter, extreme ultraviolet will be abbreviated as "EUV".

Three types of EUV light sources are known: an LPP (Laser Produced Plasma: plasma produced by a laser) type light source; a DPP (Discharge Produced Plasma: plasma produced by a discharge) type light source; and an SR (Synchrotron Radiation) type light source. An LPP type light source is a light source which generates a plasma by irradiating laser radiation upon a target material, and which employs EUV radiation emitted from this plasma. A DPP type light source is a light source which employs a plasma generated by an electrical discharge. And a SR type light source is a light source which employs radiation emitted from tracks in a synchrotron. Among these three types of light source, there are better possibilities for obtaining EUV radiation of high output with an LPP type light source as compared to the other methods, since such a light source can provide increased plasma density, and since moreover the solid angle over which the radiation is collected can be made large.

Since EUV radiation has a very short wavelength and can easily be absorbed by matter, accordingly the EUV-L technique uses a reflection type optical system. Such a reflection type optical system may be built by employing multi layers in which, for example, molybdenum (Mo) and silicon (Si) are used. Since the reflectivity of such an Mo/Si composite layer is high in the vicinity of 13.5 nm, accordingly EUV radiation of 13.5 nm wavelength is used in the EUV-L process.

However, since the reflectivity of such a composite layer is around 70%, therefore the output gradually decreases as the number of reflections increases. Since the EUV radiation is reflected ten times or more within the exposure device, accordingly it is necessary for the EUV light source device to supply EUV radiation to the exposure device at rather high output. Thus, it is expected that the use of LPP type light sources as EUV light source devices will become more common (refer to Patent Reference #1).

Moreover, the EUV light source device is required to supply EUV radiation of rather high purity to the exposure device. If radiation other than EUV radiation is mixed into the radiation which is supplied from the EUV light source device to the exposure device, then there is a possibility that the exposure contrast will be decreased, or that the accuracy of the patterning will be reduced.

Thus, in the EUV-L process, in order to eliminate undesirable spectral components in the emitted radiation, a second prior art technique has been proposed (refer to Patent Reference #2) in which a spectrum purity filter (hereinafter termed a "SPF") is employed. Although it is not explicitly so described in this second reference, the explanation herein will presume that this second prior art technique is applied to a LPP type light source device. In this case, liquid droplets of tin (Sn), for example, are supplied as targets within a vacuum chamber from a target supply device, these liquid droplets of tin are converted into plasma by being irradiated with radiation from a carbon dioxide gas laser, the radiation which is emitted from this plasma is collected by a collector mirror and is incident upon a reflective type planar diffraction lattice, and is converted into a spectrum by this planar diffraction lattice. Accordingly, in this second prior art technique, only the diffracted radiation in the EUV region centered around 13.5 nm is conducted to the exposure device.

Now, the exposure resist which is used in the exposure device is photosensitive to radiation emitted from the plasma in the wavelength region from 130 nm (DUV: Deep Ultraviolet) to 400 nm (UV: Ultraviolet). Accordingly, if a substantial amount of radiation in the range of 130 nm~400 nm is incident into the exposure device, this will cause deterioration of the exposure contrast. Moreover, if infrared radiation (IR: Infrared) is present in the radiation from the plasma, then this IR will be absorbed by optical components within the exposure device and by the mask and the wafer and so on and will cause thermal expansion, so that there is a possibility that the accuracy of the patterning will be decreased.

In particular, in the case of an EUV light source device which uses a carbon dioxide gas pulse laser which emits infrared radiation of wavelength 10.6 μm (hereinafter termed a "$CO_2$ laser") as a light source for exciting a target consisting of tin, since some of the high output of $CO_2$ laser radiation is scattered and reflected by the target, accordingly it is necessary to eliminate this scattered $CO_2$ laser radiation with an SPF. For example, if the intensity of the EUV radiation centered around the wavelength of 13.5 nm is taken as unity, then it is necessary to keep down the intensity of the $CO_2$ laser radiation included therein to 0.01 or less.

Thus, in a second prior art technique, a reflective type planar diffraction lattice is provided which separates the EUV radiation from radiation of other wavelengths, and only the EUV radiation is supplied to the exposure device. The radiation of other wavelengths outside the EUV region is absorbed by a dumper which is provided in the neighborhood of the emission aperture, and is converted into thermal energy.

Now, if a solid target such as a tin droplet is used, not all of the droplet target is excited into plasma by the CO2 laser; debris of diameter a few μm or greater is created. In other words, a portion of the target is not converted into plasma, but is expelled as waste. Thus, as shown in FIG. 1 of the second prior art technique detailed above, a thin filter is provided between the exposure device and the vacuum chamber, and thereby this debris is prevented from getting into the exposure device. By making this thin filter from a material such as zirconium (Zr) or silicon or the like whose transmittivity for EUV radiation is comparatively high, it is possible to endow the thin filter with the function of serving as an SPF.

On the other hand, as shown in a third prior art document (refer to Patent Reference #3), in the case of an SPF which uses a reflective type diffraction lattice, it is necessary to provide blazed grooves in order to enhance the efficiency of diffraction of EUV radiation. However, since it is necessary to form extremely minute grooves whose heights are several tens of nanometers at a pitch of a few μm in order to eliminate aberration of the resulting diffracted EUV radiation, accordingly curved grooves are required whose pitch changes (refer to Non-Patent Reference #1).

Thus, as described in a fourth prior art document (refer to Patent Reference #4), it is proposed to create a reflective type SPF by processing an Mo/Si composite layer which has been coated onto the front surface of a mirror into the shapes of blazed grooves.

Patent Reference #1: Japanese Laid-Open Patent Publication 2006-80255.
Patent Reference #2: U.S. Pat. No. 6,809,327.
Patent Reference #3: U.S. Pat. No. 6,469,827.
Patent Reference #4: U.S. Pat. No. 7,050,237.
Non-Patent Reference: "EUV spectral purity filter: optical and mechanical design, grating fabrication, and testing", H. Kierey et al., "Advances in Mirror Technology for X-Ray, EUV-Lithography, Laser and Other Applications", edited by Ali M. Khounsary, Udo Dinnger, and Kazuya Ohta, Proceedings of SPIE, Vol. 5193.

SUMMARY OF THE INVENTION

The following problems are present with the prior art techniques described above. The first such problem is that there are issues with the efficiency and the reliability of a thin layer type SPF. Since the transmittivity of the above thin layer type SPF which separates the exposure device from the EUV light source is as low as around 40%, the output efficiency for EUV radiation is decreased. Moreover, a thin layer type SPF can easily be damaged due to debris flying off and striking it. Furthermore, when a thin layer type SPF absorbs radiation of wavelengths other than that of EUV radiation so that its temperature becomes elevated, it may melt due to heat, which is undesirable. Thus, there are problems with a thin layer type SPF with regard to transmittivity to EUV radiation, and with regard to reliability and convenience of use.

The second problem is that, with the fourth prior art technique described above in which the composite layer is subjected to blazing processing, it is necessary to superimpose a total of 2000 or more of the Mo/Si multi layers. In order reliably to separate the radiation into diffracted EUV radiation and regularly reflected radiation of other wavelengths, the blaze angle must be set to be large, and it becomes necessary to provide 2000 or more multi layers in order to increase the blaze angle in this manner.

The third problem is that, both with a thin layer type SPF and with an SPF which uses a reflective type diffraction lattice, the diffraction efficiency and the transmittivity for EUV radiation is low, and around 30% of the output of the EUV light source is consumed uselessly in the SPF.

The present invention has been conceived in view of the problems described above, and an objective thereof is to provide a mirror for extreme ultra violet, a manufacturing method for a mirror for extreme ultra violet, and a far ultraviolet light source device, which are capable of selecting only EUV radiation, without using any separate spectrum purity filter. Another objective of the present invention is to provide a mirror for extreme ultra violet, a manufacturing method for a mirror for extreme ultra violet, and a far ultraviolet light source device, which, by laminating together a plurality of regions in which the numbers and shapes of the multi layers are different, are capable of taking advantage of various different beneficial diffraction effects. Yet further objectives of the present invention will become clear from the subsequent description of certain embodiments thereof.

In order to solve the problems described above, a mirror for extreme ultra violet according to a first aspect of the present invention comprises: a substrate portion; a foundation portion formed from a first composite layer which is provided on one side of the substrate portion; and a reflecting portion made by forming grooves of predetermined shapes in a second composite layer which is integrally provided on the other side of the foundation portion from the substrate portion.

In a preferred embodiment, the reflecting portion may be formed so as to have a focal point, and so that extreme ultra violet reflected by the reflecting portion is gathered together at the focal point.

In a preferred embodiment, a radiation shield member having an aperture portion for passing the extreme ultra violet may be provided in the neighborhood of the focal point.

In a preferred embodiment, each of the first composite layer and the second composite layer may be formed integrally from a plurality of pair layers, with the thickness dimension of the plurality of pair layers which constitutes each of the first composite layer and the second composite layer being set according to the angle at which extreme ultra violet is incident thereupon.

The grooves of predetermined shape may be made as blazed grooves. Or, the grooves of predetermined shape may be made as triangular roof-like grooves. Or, the grooves of predetermined shape may be made as undulating wave-like grooves.

In a preferred embodiment, the grooves of predetermined shape may be provided as concentric circles or parallel lines.

In a preferred embodiment, the total number of pair layers which constitute the combination of the first composite layer and the second composite layer is in the range from 100 to 1000.

And, in order to solve the problems described above, in a method for manufacturing a mirror for extreme ultra violet according to a second aspect of the present invention, while rotating a substrate portion upon one surface of which is formed a composite layer consisting of a predetermined number of pair layers, portions of the composite layer are removed by irradiating a beam for processing upon the composite layer via a mask, so as to leave grooves of predetermined shapes.

The beam for processing may be irradiated towards the composite layer while rotating the beam for processing around a predetermined rotational axis as a center.

The predetermined rotational axis may correspond to a point at which plasma is generated.

The reflecting portion may have a focal point; and the predetermined rotational axis may be set to correspond to the position of the focal point.

And, in order to solve the problems described above, a source device for extreme ultra violet according to a third aspect of the present invention, which generates extreme ultra violet by irradiating laser radiation upon a target material and converting it to plasma, comprises: a first chamber to which a first exhaust pump is provided; a second chamber, connected to the first chamber, and to which a second exhaust pump is provided; a target material supply means which supplies the target material to within the first chamber; a laser light source which, by irradiating laser radiation upon the target material, converts the target material into plasma so that it emits extreme ultra violet; a mirror for extreme ultra violet which collects the extreme ultra violet emitted from the plasma by reflecting it towards a focal point which is provided within the second chamber; a radiation shield means which is provided in the neighborhood of the focal point, having an aperture portion which allows the passage of the extreme ultra violet, while attenuating electromagnetic waves of wavelength other than that of the extreme ultra violet with portions other than the aperture portion; and an interception valve which either communicates or intercepts an outlet portion at which the extreme ultra violet collected at the focal point is outputted; and the mirror for extreme ultra violet comprises: a substrate portion which is formed to be curved in at least one direction; a foundation portion formed from a first composite layer which is provided on one side of the substrate portion; and a reflecting portion made by forming grooves of predetermined shapes in a second composite layer which is integrally provided on the other side of the foundation portion from the substrate portion.

The grooves of predetermined shapes may be blazed grooves, triangular roof-shaped grooves, or undulating wave-like grooves.

Approximately at the position where the laser radiation reflected by the reflecting portion is focused, there may be provided an absorption means which absorbs this reflected laser radiation.

There may also be included a plurality of magnetic field generation means, so that charged particles emitted from the plasma are captured by a magnetic field generated from the magnetic field generation means.

BRIEF DESCRIPTION OF THE DRAWINGS

FIG. 8 is an explanatory figure showing examples of blazed grooves of an EUV collector mirror according to a third embodiment;

FIG. 12 is an explanatory figure showing a method of manufacturing an EUV collector mirror according to a sixth embodiment;

DESCRIPTION OF THE SPECIFIC EMBODIMENTS

In the following, various embodiments of the present invention will be described in detail with reference to the drawings. As explained subsequently, in these embodiments, a EUV collector mirror is shown as an example of a mirror which reflects EUV radiation. Moreover, in these embodiments, a reflective type diffraction lattice is provided internally to the EUV collector mirror, so that the collector mirror is endowed with both the function of focusing and also the function of serving as a SPF. Furthermore, in these embodiments, by providing grooves of predetermined shapes in the multi layers upon the collector mirror, it is possible to utilize three types of diffraction operation: Bragg reflection by the multi layers of the foundation portion and by the multi layers of the portion in which the grooves of predetermined shape are provided; diffraction due to the repeated pattern of the multi layers which emerges at the front surfaces of the grooves of predetermined shape; and diffraction due to the grooves of predetermined shape themselves. In these embodiments, as examples of these grooves of predetermined shapes, grooves shaped as blazed grooves, triangular roof-like grooves, and wave-like grooves will be explained.

Embodiment 1

Figure 1:
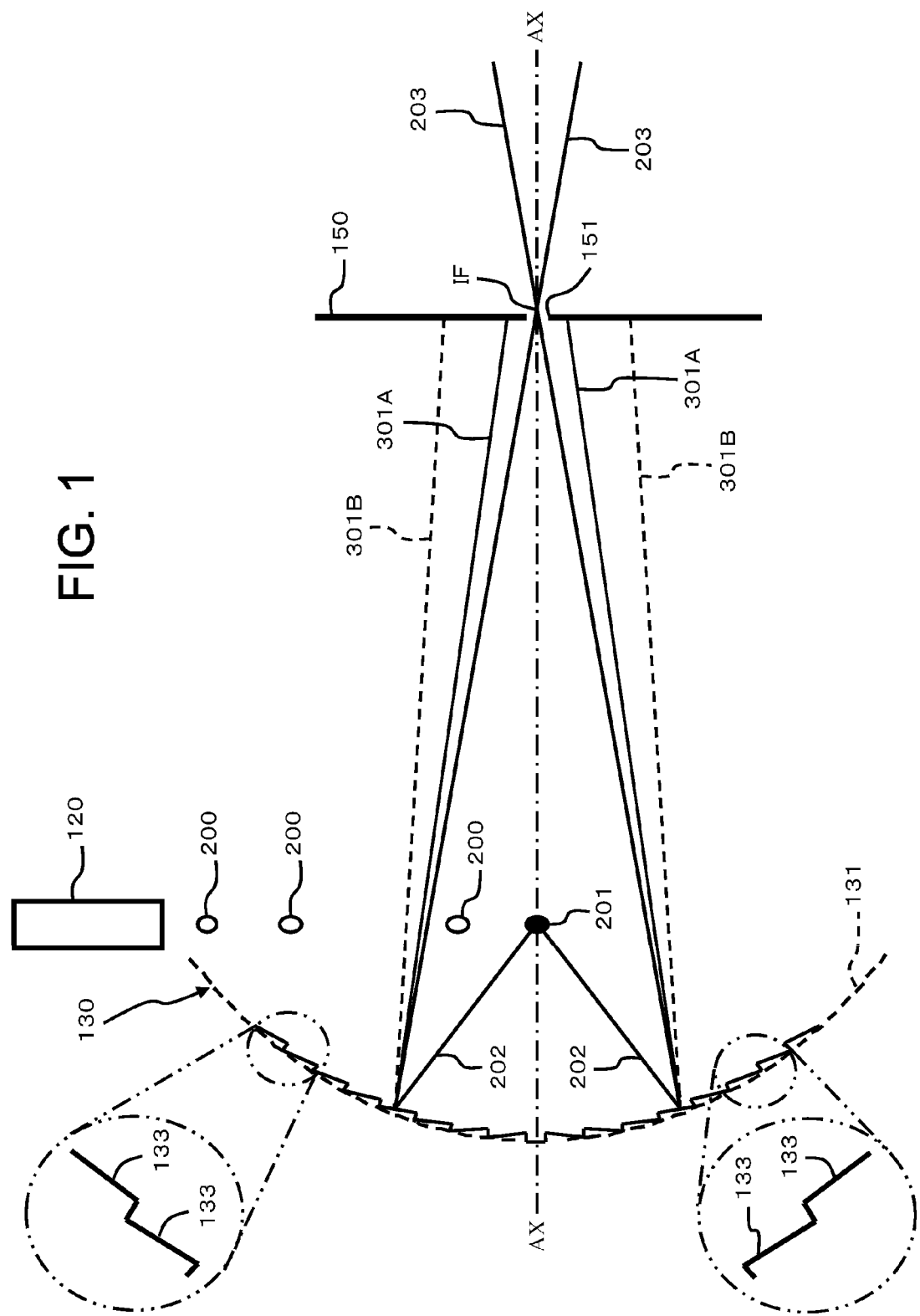
FIG. 1 is an explanatory figure showing a magnified view of an EUV collector mirror according to a first embodiment of the present invention.
Figure 2:
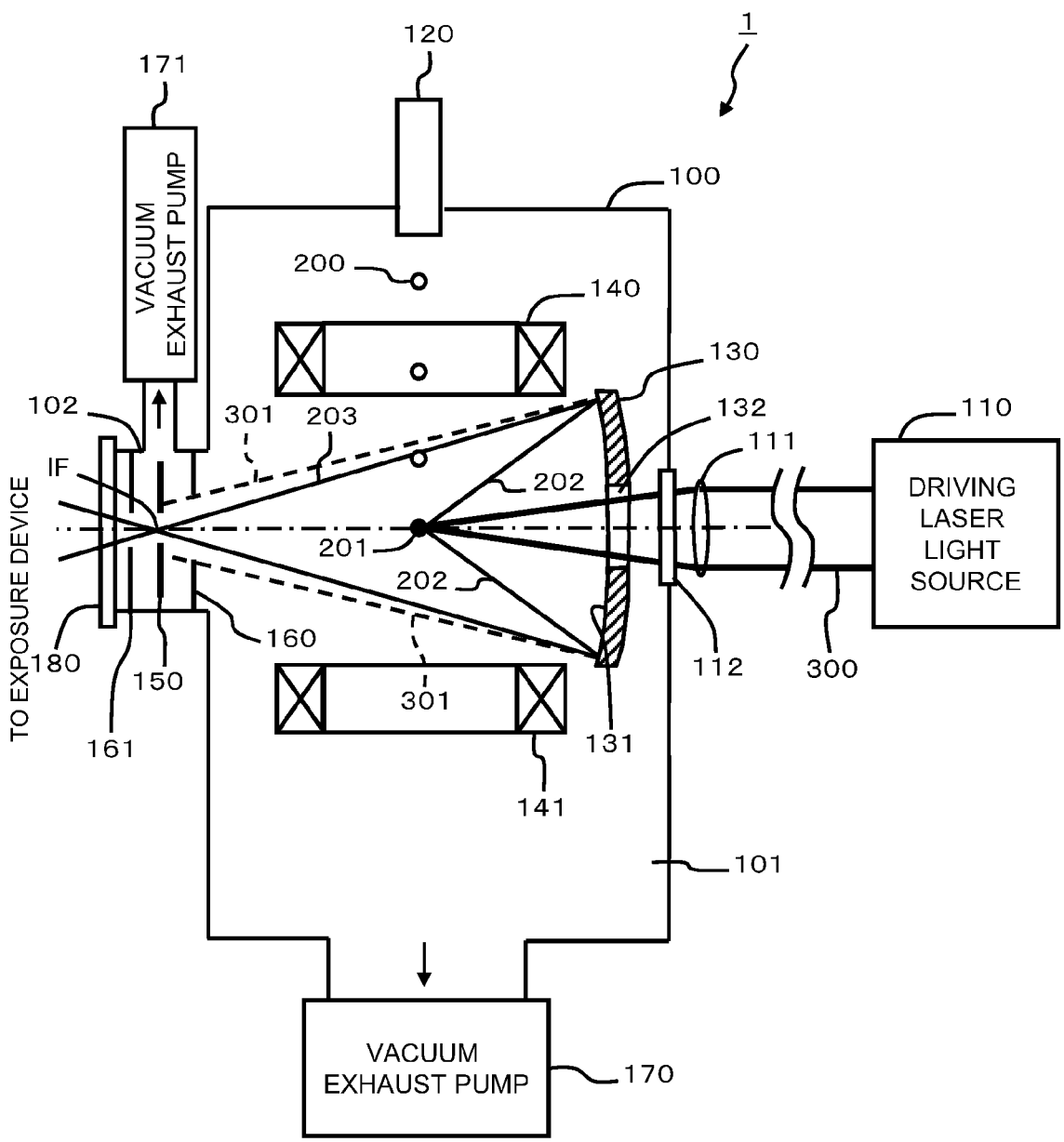
FIG. 2 is an explanatory figure showing an EUV light source device which incorporates this EUV collector mirror.
Figure 3:
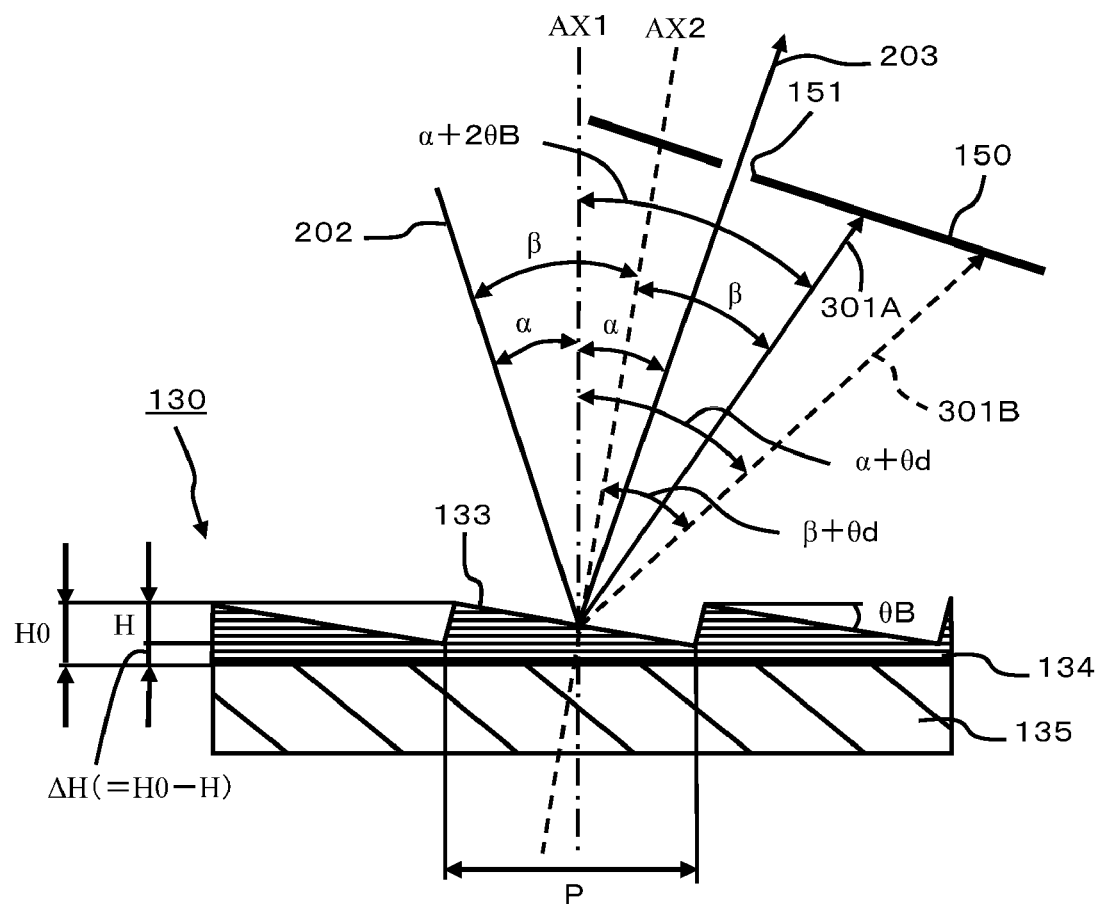
FIG. 3 is a sectional view showing a magnified view of blazed grooves of this EUV collector mirror.
Figure 4:
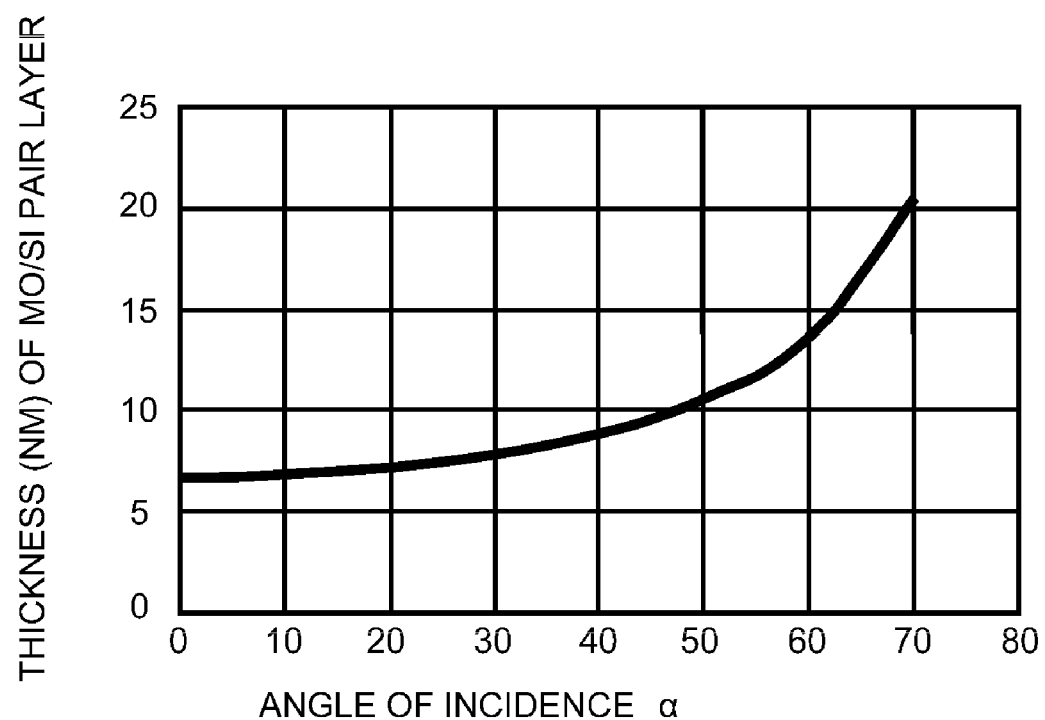
FIG. 4 is a characteristic figure for the setting of Mo/Si pair layer thickness according to the angle of incidence.

A first embodiment will now be explained on the basis of FIGS. 1 through 4. FIG. 1 is an explanatory figure showing a magnified view of an EUV collector mirror according to this first embodiment; FIG. 2 is an explanatory figure showing an EUV light source device which incorporates this EUV collector mirror 130; FIG. 3 is an explanatory sectional view showing a magnified view of blazed grooves of this EUV collector mirror 130; and FIG. 4 is a characteristic figure for the setting of Mo/Si pair layer thickness according to the angle of incidence of EUV radiation. First the structure of the EUV light source device 1 will be explained with reference to FIG. 2, and then the structure of the EUV collector mirror 130 will be explained with reference to FIG. 1 etc.

The EUV light source device 1 shown in FIG. 2 comprises, for example, a vacuum chamber 100, a driver laser light source 110, a target supply device 120, the EUV collector mirror 130, coils for magnetic field generation 140 and 141, an SPF shield 150 having an aperture portion 151, dividing wall apertures 160 and 161, vacuum exhaust pumps 170 and 171, and a gate valve 180, each of which will be described hereinafter.

The vacuum chamber 100 is made by connected together a first chamber 101 whose volume is relatively large, and a second chamber 102 whose volume is relatively small. The first chamber 101 is a main chamber in which generation of plasma and so on is performed. And the second chamber 102 is a connection chamber, and is for supplying the EUV radiation emitted from the plasma to the exposure device.

The first vacuum exhaust pump 170 is connected to the first chamber 101 as a "first exhaust pump", and the second vacuum exhaust pump 171 is connected to the second chamber 102 as a "second exhaust pump". Due to this, each of these chambers 101 and 102 is maintained in a vacuum state. It would be acceptable to constitute each of these vacuum exhaust pumps 170 and 171 as a separate pump, or alternatively to constitute them as one single combined pump.

The target supply device 120 supplies targets 200 as droplets of solid or liquid by, for example, applying heat to a material such as tin (Sn) or the like and melting it. It should be understood that while, in this explanation of the first embodiment, tin is suggested as an example of a target material, this is not limitative of the present invention; it would also be acceptable to utilize some other material, such as, for example, lithium (Li) or the like. Or, it would also be acceptable to provide a structure in which targets are supplied in any one of the gaseous, liquid, or solid state, using a material such as argon (Ar), xenon (Xe), krypton (Kr), water, alcohol, or the like. Furthermore, it would also be acceptable to supply targets consisting of liquid or frozen droplets of stannane ($SnH_4$), tin tetrachloride ($SnCl_4$), or the like.

The driver laser light source 110 outputs laser pulses for exciting the targets 200 which are supplied from the target supply device 120. This driver laser light source 110 may, for example, consist of a $CO_2$ (carbon dioxide gas) pulse laser light source. The driver laser light source 110 may, for example, emit laser radiation with the specification of: wavelength 10.6 μm, output 20 kW, pulse repetition frequency 100 khZ, and pulse width 20 nsec. It should be understood that, while a $CO_2$ pulse laser is suggested here as an example of a laser light source, this should not be considered as being limitative of the present invention.

The laser radiation for excitement which is outputted from the driver laser light source 110 is incident into the first chamber 101 via the focusing lens 111 and the incidence window 112. This laser radiation which is incident into the first chamber 101 irradiates a target 200 which is supplied from the target supply device 120, via an incidence aperture 132 which is provided to the EUV collector mirror 130.

When the laser radiation irradiates the target, a target plasma 201 is generated. In the following, for convenience, this will simply be termed the "plasma 201". This plasma 201 emits EUV radiation 202 centered around the wavelength of 13.5 nm. This EUV radiation 202 which has been emitted from the plasma 201 is incident upon the EUV collector mirror 130, and is reflected thereby. The reflected radiation 203 is focused at an intermediate focal point (IF: Intermediate Focus) which is a focal point. The details of the EUV collector mirror 103 will be described hereinafter with further reference to the figures. And this EUV radiation which has thus been focused at the focal point IF is conducted to the exposure device via the gate valve 180, which is in its opened state.

A pair of coils 140 and 141 for magnetic field generation are provided above and below the optical path which the EUV radiation 202 and 203 pursues from the plasma 201 via the EUV collector mirror 130 towards the focal point IF. The axes of these two coils 140 and 141 coincide. Each of the coils 140 and 141, for example, may consist of an electromagnet which has a superconducting coil. When electrical currents flow in the same direction in both of the coils 140 and 141, a magnetic field is generated. This magnetic field has high magnetic flux density in the neighborhoods of the coils 140 and 141, and has a lower magnetic flux density at points intermediate between the coils 140 and 141.

When the laser radiation is irradiated upon the target, debris is created. Debris which carries electric charge (ions such as plasma and so on) is captured by the magnetic field generated by the coils 140 and 141, and moves downward in FIG. 1 while executing helical motion due to Lorentz force. This debris which has moved downwards is sucked out by the first vacuum exhaust pump 170 and is exhausted to the exterior of the first chamber 101. The position at which the magnetic field generation device (in this embodiment, the coils 140 and 141) is installed should be a position at which the ionized debris can be discharged by the magnetic flux generated by the device, while avoiding the various optical components of the system. Accordingly, the configuration shown in the figure should not be considered as being limitative of the present invention.

While the laser radiation which irradiates the target is exciting the target, it is scattered by being reflected by the target and by being reflected by the plasma 201. And the laser radiation which is thus reflected by the target and so on is incident upon the EUV collector mirror 130 and is reflected and diffracted thereby. However, this reflected and diffracted laser radiation has a wavelength which is different from that of EUV radiation, and is focused at a position which is different from that of the focal point IF. Accordingly, the reflected and diffracted laser radiation is intercepted by the SPF shield 150. In other words, since the aperture portion 151 of the SPF shield 150 (refer to FIG. 1) is provided so as to correspond to the focal point IF, accordingly the reflected and diffracted laser radiation 301 which is directed towards a position which is different from that of the focal point IF does not pass through the aperture portion 151, but is intercepted by the wall portion of the SPF shield 150. The aperture portion 151 may, for example, be formed to have an inner diameter of a few millimeters.

Just as with the laser radiation (which is IR), the radiation other than EUV (such as DUV, UV, and VIS) which is generated from the plasma 201 is also focused at some position other than the focal point IF, and accordingly it is intercepted by the SPF shield 150 which is installed so as to correspond to the focal point IF.

In this manner, the SPF shield 150 only passes the EUV radiation through its aperture portion 151, while intercepting radiation of other wavelengths which is proceeding towards the exposure device. Thus, the SPF shield 150 absorbs the DUV, UV, VIS, and IR and converts them to heat. Accordingly, the SPF shield 150 is provided with a water cooling system for heat radiation. Moreover, the substrate portion 135 of the EUV collector mirror 130 (refer to FIG. 3) is made from some material such as silicon or nickel (Ni) alloy whose thermal conductivity is good, and it may also be cooled with a water cooling jacket or the like.

For convenience, explanation of the power supply device and the wiring which supply electrical current to the coils 140 and 141, and of the mechanisms for cooling the SPF shield 150 and the EUV collector mirror 130 and so on, will herein be omitted, and moreover these elements are not shown in the figures. However, without undue experimentation, a person of ordinary skill in the art will be able to design a suitable such power supply construction and a suitable such cooling construction based upon the disclosure in this specification, and will also be able actually to manufacture them.

Two further dividing walls 160 and 161 with apertures are disposed before and after the focal point IF. In other words, when the direction of progression of the EUV radiation 203 which has been reflected by the EUV collector mirror 130 is taken as a reference, the first dividing wall 160 with its aperture is provided before the focal point IF, while the second dividing wall 161 with its aperture is provided after the focal point IF. The diameters of the apertures in these dividing walls 160 and 161 may, for example, be from a few millimeters to around ten millimeters.

The first dividing wall 160 is provided in the neighborhood of the position where the first chamber 101 is connected to the second chamber 102, while the second dividing wall 161 is provided in the neighborhood of the position where the second chamber 102 is connected to the exposure device. The SPF shield 150 is provided so as to correspond to the focal point IF, at an intermediate position between the dividing walls 160 and 161.

To put it in another manner, the focal point IF is provided so as to be positioned within the second chamber 102, i.e. outside the first chamber 101, and the dividing walls 160 and 161 are disposed so as to partition before and after the focal point IF.

A high vacuum state is maintained within the first chamber 101 by the first vacuum exhaust pump 170, and a vacuum state is maintained within the second chamber 102 by the second vacuum exhaust pump 171. The pressure within the first chamber 101 is set to be lower than the pressure within the second chamber 102. Moreover, the ions (i.e. the electrified debris particles) within the first chamber 101 are captured by the magnetic field which is generated by the coils 140 and 141.

Accordingly, it is possible to prevent any of the debris which is created within the first chamber 101 from getting into the second chamber 102. Moreover, even if some debris or the like should get into the second chamber 102, nevertheless, due to the operation of the second vacuum exhaust pump 171, it is possible to extract this debris or the like to the exterior of the second chamber 102. Because of this structure, it is possible effectively to prevent any debris or the like from getting into the exposure device.

As described above, in this embodiment, the magnetic field which is created by the coils 140 and 141 is utilized as a protection means for protecting the various optical elements from debris which flies off from the plasma 201. These various optical elements include the EUV collector mirror 130, the incidence window 112, incidence windows for optical sensors of various types (not particularly shown) which are provided for observing phenomena within the vacuum chamber 100, and so on.

Since the ions in the debris which is emitted from the plasma 201 are electrically charged, they are captured by the magnetic field and are discharged by the first vacuum exhaust pump 170. However, neutral debris which is not electrically charged is not constrained by the magnetic field.

Accordingly, if no particular countermeasures were to be instituted, this neutral debris gradually contaminates the various optical elements within the vacuum chamber 100 and damages them. Moreover, if and when such neutral debris within the first chamber 101 gets into the exposure device via the second chamber 102, it may also even contaminate the various optical elements within the exposure device.

By contrast, in this embodiment, the construction is such that the vacuum chamber 100 is subdivided into the first chamber 101 whose volume is relatively greater and the second chamber 102 whose volume is relatively smaller, and moreover the pressure within the first chamber 101 is set to be lower than the pressure within the second chamber 102. Furthermore, the first dividing wall 160 is provided so as to separate between the first chamber 101 and the second chamber 102, so that, in addition to limiting spatial migration from the first chamber 101 and the second chamber 102, the probability of neutral debris getting into the second chamber 102 from the first chamber 101 is reduced. Even if neutral debris should get into the second chamber 102, this debris will be discharged to the exterior by the second vacuum exhaust pump 171. Accordingly, in this embodiment, it is possible to prevent debris within the EUV light source device 1 from getting into the exposure device, before it even happens.

Although it is possible to prevent the exposure device from being contaminated by debris, neutral debris gradually diffuses and piles up within the vacuum chamber 100.

Accordingly, depending upon the time period which elapses, there is a possibility that the front surface 131 of the EUV collector mirror 130 may gradually become contaminated by debris. In this case, maintenance work should be performed.

In such maintenance work, for example, the operation of the EUV light source device 1 is stopped, the gate valve 180 is closed so as perfectly to intercept communication between the exposure device and the vacuum chamber 100, and the EUV collector mirror 130 is cleaned with an etchant gas.

For example, hydrogen gas, a halogen gas, a hydrogenated halogen gas, argon gas, or a mixture thereof may be used as the etchant gas. The EUV collector mirror 130 could also be heated by a heat application device not shown in the figures, in order to promote the cleaning thereof. Moreover, it might also be arranged to excite the etchant gas with RF (Radio Frequency) radiation or with microwaves, in order to promote the cleaning.

When the cleaning has been completed, the supply of the etchant gas to the vacuum chamber 100 is stopped, and, after a sufficient level of vacuum has been established by the vacuum exhaust pumps 170 and 171, the gate valve 180 is opened, and the operation of the EUV light source device 1 is resumed.

Next, the EUV collector mirror 130 will be explained with reference to FIGS. 2 and 3. In FIG. 1, for convenience, the incidence aperture 132 for allowing the passage of laser radiation is omitted.

The front surface 131 of the EUV collector mirror 130 is made so as to possess at least one overall curvature. For example, this front surface 131 of the EUV collector mirror 130 may be made as a concave surface which is an ellipsoid of revolution, as a paraboloid, as a spherical surface, or as a concave surface having a plurality of curvatures.

A composite layer which selectively reflects radiation at a predetermined wavelength is formed upon the front surface 131. In this embodiment, this predetermined wavelength is 13.5 nm. This composite layer is made by laminating together a large number of pair layers made from molybdenum and silicon (Mo/Si). Moreover, as shown in FIG. 3, a large number of blazed grooves 133 are formed upon this composite layer which covers the front surface 131.

As shown in FIG. 1 and in magnified view in FIG. 3, the blazed grooves 133 of this embodiment are formed so that their abrupt step portions face towards the center of the mirror (the axis AX). To express this in the opposite manner, each of the blazed grooves 133 is formed so that its sloping portion inclines relatively gently from the center of the mirror (the axis AX) towards the outer edge of the mirror. It should be understood that the shapes of the blazed grooves 133 are not limited to those shown in FIG. 1. As will be shown in embodiments which are described subsequently, it is possible for the blazed grooves 133 to be formed in various shapes.

As already described, the EUV radiation in the radiation which is generated by the plasma 201 is incident upon the EUV collector mirror 130 which has the blazed grooves 133 and is reflected and diffracted, and is focused at the focal point IF which is set to be within the second chamber 102. Among this EUV radiation which is incident upon the EUV collector mirror 130, around 60% to 70% is collected together at the focal point IF and is supplied to the exposure device as the EUV radiation 203.

The laser radiation which is scattered or reflected by the target is incident upon the EUV collector mirror 130 and is reflected or diffracted. Both the reflected laser radiation 301A and the diffracted laser radiation 301B (the primary diffracted radiation) are directed towards positions which are different from the focal point IF. Due to this, the reflected laser radiation 301A and the diffracted laser radiation 301B are intercepted by the wall portion of the SPF shield 150, and are prevented from entering the exposure device. In a similar manner, DUV, UV, and VIS radiation are also intercepted by the wall portion of the SPF shield 150, and thus are not supplied into the exposure device.

By contrast, the EUV radiation passes through the aperture portion 151 of the SPF shield 150 and is conducted to the exposure device. This is because all of the optical conditions are set in advance so that the EUV radiation is focused at the focal point IF, and the aperture portion 151 of the SPF shield 150 is provided so as to correspond to the focal point IF.

FIG. 3 is a sectional view showing a portion of the EUV collector mirror in magnified form. In FIG. 3, the axial line AX1 is an axis which is perpendicular to the substrate portion 135 of the EUV collector mirror 130, while the other axial line AX2 is an axis which is perpendicular to the sloping surface of one of the blazed grooves 133.

The substrate portion 135 of the EUV collector mirror 130 is made from a material such as silicon or nickel alloy or the like whose thermal conductivity is good, and is formed so as to have a concave surface (such as an ellipsoid of revolution) which has the focal point IF. A predetermined number of multi layers (Mo/Si pair layers) are coated upon the front surface of the substrate portion 135 (which is its upper surface in FIG. 3, and corresponds to "a surface" in the Claims). In this embodiment, the number of Mo/Si pair layers which are coated upon the substrate portion 135 is in the range from 100 to 1000. And desirably, in this embodiment, around 300 of these Mo/Si pair layers should be laid over one another upon the front surface 131. Each of these Mo/Si pair layers is a pair layer which consists of one molybdenum layer and one silicon layer, and the composite layer is made by laminating together a large number of such Mo/Si pair layers.

The blazed grooves 133 are processed (to a depth H) into around 250 of the 300 pair layers of the composite layer upon the mirror front surface (whose total thickness is H0), while the approximately 50 layers at the bottom, which constitute a composite sub-layer) are left just as they are. The approximately 50 pair layers (the composite sub-layer of thickness ΔH) at the bottom of the composite layer correspond to the "first composite layer" of the Claims. A foundation portion 134 is formed from this composite sub-layer of thickness ΔH. In order to cause the EUV radiation to be reflected by this foundation portion 134 by Bragg reflection, this foundation portion 134 should consist of from around 40 to around 60 of the Mo/Si pair layers. The composite sub-layer (of thickness H) consisting of around 250 pair layers which is positioned over the foundation portion 134, and in which the blazed grooves 133 are formed, corresponds to the "second composite layer" of the Claims, while the blazed grooves 133 correspond to the "reflecting portion" of the Claims.

It should be understood that the various numerical values given above for numbers of pair layers (sub-layer thicknesses) of 300, 250, and 50, are only cited by way of example for convenience of explanation; the present invention should not be considered as being limited to these numerical values.

Finally, the number of the pair layers may be any value within the range from 100 to 1000, provided that the foundation portion 134 is able to manifest the function of reflecting the EUV radiation by Bragg reflection, while the blazed grooves 133 are able to manifest both the function of diffracting the EUV radiation due to the pattern of the multi layers, and also the function of diffracting the EUV radiation due to the pattern of the blazed grooves themselves.

If the number of the pair layers is less than 100, then it is not possible to obtain the required blaze angle θB, so that sometimes it may be the case that it is not possible sufficiently to separate the EUV radiation from the radiation of other wavelengths. By contrast, if the number of the pair layers is greater than 1000, then a great deal of labor must be utilized during fabrication of the mirror, and moreover the internal stress is increased, so that there is a possibility that the composite layer may become detached.

Thus, in this embodiment, as one example of a value between 100 and 1000, the value of 300 is selected for the number of pair layers, and the above described reflective type diffraction lattice made from this number of pair layers is provided integrally upon the EUV collector mirror 130. The more multi layers are provided as stacked over one another, the greater is it possible to make the blaze angle θB, so that it is possible to separate the EUV reflected radiation 203 and the radiation 301A and 301B of other wavelengths, in a simple and easy manner.

In this embodiment, it is possible to set the number of Mo/Si pair layers which are laminated together to any value in the range from 100 to 1000, and it is possible to reduce the stress set up in the composite layer, and thus to prevent detachment of the composite layer. Moreover, with regard to the efficiency of reflection of EUV radiation, since it is possible to keep the performance around 60% to 70% which is similar to that of the prior art, accordingly it is possible to enhance the efficiency of supply of EUV radiation to the exposure device.

If a structure is employed which incorporates both a conventional EUV collector mirror which is not equipped with any SPF function and also a separate reflective type diffraction lattice, then there is a loss of around 30% of the EUV radiation at the EUV collector mirror, and moreover there is also a further loss of around 30% of the EUV radiation at the separate reflective type diffraction lattice. In other words, in the case of this structure, it is only finally possible to supply around 50% of the EUV radiation to the exposure device, because the EUV radiation is reflected twice before being incident into the exposure device. By contrast, since the EUV collector mirror 130 of this first embodiment of the present invention is endowed with the function of acting as a SPF, accordingly it is possible to conduct the EUV radiation to the exposure device while only reflecting it once. In other words, the loss of the EUV radiation is limited to around 30%. Moreover, in this embodiment, the radiation other than EUV radiation, which is not required and is undesirable, is prevented from being incident into the exposure device by the SPF shield 150 which is provided to correspond to the focal point IF, and accordingly it is possible to supply only EUV radiation of high purity to the exposure device.

It should be understood that it would also be acceptable, after the frontmost surface of the mirror has been processed in order to produce the blazed grooves 133, to coat it with ruthenium (Ru) or the like so that the exposed portion of the Mo/Si layer which has been processed does not become oxidized; and this results in a structure with which decrease of the diffraction efficiency for the EUV radiation is prevented. Moreover, as will be explained hereinafter with reference to FIG. 4, it is desirable for the thicknesses of the Mo/Si pair layers to be set according to the angle of incidence of the EUV radiation.

A concrete example will now be described. On the assumption that the thicknesses of the Mo/Si pair layers are 6.9 nm, then the thickness H of 300 of these layers will be 2.070 μm. If the blazed grooves 133 are formed at a pitch P of 400 μm in a composite layer which consists of 250 of the pair layers, then the blaze angle θB is 4.3 mrad. Accordingly, 2θB is equal to 8.6 mrad.

And, if for example it is supposed that the radius of curvature of the EUV collector mirror 130 is 181.8 mm and the conic constant is −0.67, then the distance from the elliptically shaped front surface 131 of the EUV collector mirror 130 (i.e. the mirror surface) to the focal point IF is about 1 m.

If the angle of incidence of the EUV radiation 202 which is incident from the plasma 201 upon the EUV collector mirror 130 is termed α, then the EUV radiation 203 is reflected at almost the angle α towards the focal point IF, and passes through the aperture portion 151 of the SPF shield 150.

By contrast, the DUV, UV, VIS, and IR radiation components such as the laser radiation are regularly reflected at an angle α+2θβ. Accordingly, at the position of the focal point which is approximately 1 m ahead, the EUV reflected radiation 203 and the regularly reflected radiation 301A such as laser radiation and so on, are separated by a gap of about 8.6 mm.

Furthermore, IR radiation such as the laser radiation is diffracted at an angle of α+θd by the blazed grooves 133. Since, in this embodiment, the wavelength of the laser radiation is 10.6 μm, accordingly the angle θd in FIG. 3 is 27.6 mrad.

Although for the sake of convenience this feature is not shown in the figure, the DUV, UV, and VIS are diffracted by the gratings which are formed by the periodic stripe patterns of the alternating molybdenum and silicon layers appearing upon the sloping surfaces of the blazed grooves 133 (in this embodiment, these stripe patterns have pitch of 1.54 μm), and follow paths at angles which are different from that of the EUV radiation 203.

Accordingly, by arranging the aperture portion 151 which has a diameter of 4 to 6 mm at the position of the focal point IF at which the EUV radiation 203 is gathered together, it is possible to select only the EUV radiation 203, and to conduct it to the exposure device.

As described above, a reflective type diffraction lattice is integrally provided upon the front surface of the EUV collector mirror 130 by processing the multiple Mo/Si layers of which it is composed into blazed grooves. As shown in FIG. 2, when the radiation 202 from the plasma 201 is incident at the angle α upon this EUV collector mirror 130, the EUV radiation therein is reflected at almost the angle α. The reflection efficiency is 60% to 70%.

The radiation in the DUV and UV regions is reflected by the diffraction lattice which is formed by the periodic stripes of molybdenum and silicon appearing upon the processed sloping surfaces of the blazed groove shapes of the composite layer consisting of multiple Mo/Si pair layers, and is diffracted at an angle which is different from that of the EUV radiation 203.

The radiation in the VIS and IR regions, and in particular the laser radiation (of wavelength 10.6 μm) from the driver laser light source 110, is diffracted by the blazed grooves 133 at the angle α+θd (or α−θd), which is different from the angle of the EUV radiation 203.

Moreover, due to the blazed grooves 133 (which have blaze angle θB), except for the EUV radiation 203, the DUV, UV, VIS, and IR are regularly reflected at the angle of α+2θB by the surfaces which are at the angle θB. Accordingly it is possible to extract only the EUV radiation 203, which is reflected or diffracted at almost the angle α, and to supply it to the exposure device. In other words, this EUV collector mirror 103 also is endowed with the function of a SPF.

FIG. 4 shows a characteristic for setting the thickness of the Mo/Si pair layers according to the angle of incidence (α) of the EUV collector mirror 130. As shown in FIG. 4, as the angle of incidence increases from 0° to 50°, the thickness of the pair layers increases from around 6 nm to around 10 nm. When the angle of incidence α is 12°, the thickness of the pair layers is 6.9 nm. From the general vicinity where the angle of incidence exceeds 50°, the rate of increase of the thickness of the pair layers becomes great. When the angle of incidence is around 70°, the thickness of the pair layers becomes around 20 nm. Naturally, the characteristic shown in FIG. 4 is only given by way of example; the present invention is not to be considered as being limited to the characteristic shown in FIG. 4.

Since the EUV collector mirror 130 of this embodiment includes the foundation portion 134 and the blazed grooves 133, both of which are made from a composite of multiple Mo/Si pair layers, accordingly it is capable of providing diffraction operation of the following three types.

The first diffraction operation is Bragg reflection. The Mo/Si composite layer which constitutes the foundation portion 134 positioned at the bottom surface of the EUV collector mirror 130 and the composite layer upon which the blazed grooves 133 are formed operate as a reflecting mirror in a similar manner to an EUV collector mirror in the prior art, and perform Bragg reflection of EUV radiation of wavelengths centered around 13.5 nm. As shown in FIG. 4, the thicknesses of the pair layers in the composite layer which is the foundation portion 134 and in the composite layer upon which the blazed grooves 133 are formed are changed according to the angle of incidence α, for example over the range from 6.9 nm to 20 nm.

The second diffraction operation is diffraction by the periodic striped pattern of molybdenum and silicon which appears at the front surfaces (i.e. the sloping surfaces) of the blazed grooves 133. The pitch of this striped pattern varies according to the thicknesses of the pair layers, and changes within the range of several hundreds of nanometers to a few micrometers. The EUV, DUV, UV, and VIS are diffracted by this second diffraction operation.

The third diffraction operation is diffraction by the blazed grooves 133 themselves. These blazed grooves 133 are formed at a comparatively large pitch, for example from several hundreds of micrometers to a few millimeters. The VIS and the IR are diffracted by this third diffraction operation.

Here, by setting the thickness of the Mo/Si pair layers according to the angle of incidence α (refer to FIG. 4), it is possible to diffract the EUV radiation by the second diffraction operation at an angle which is almost the same as that at which it is diffracted by the first diffraction operation. In other words, the angle at which the EUV radiation is reflected by the foundation portion 134, and the angle of diffraction by the periodic striped pattern which appears on the sloping surfaces of the blazed grooves 133, are made to be almost the same, so that it is possible to supply the EUV radiation to the focal point IF in an efficient manner.

With this embodiment which has the structure described above, since the blazed grooves 133 are formed by processing the sub-layer of the EUV collector mirror 130 which is made by superimposing a predetermined number of Mo/Si pair layers, accordingly not only is the EUV collector mirror 130 endowed with its basic function of reflecting the EUV radiation, but also with the function of acting as an SPF which separates the EUV radiation from the radiation of other wavelengths. Furthermore, in this embodiment, since the SPF shield 150 is provided at the focal point IF at which the EUV radiation is focused, accordingly it is possible to supply only the EUV radiation to the exposure device. Due to this, in this embodiment, it is possible to supply a greater proportion of the EUV radiation to the exposure device, as compared to the case in which a separate reflective type diffraction lattice is used, and moreover it is possible to reduce the number of components in the EUV light source device 1, thus keeping its manufacturing cost low.

Since, in this embodiment, no thin layer type SPF is required, accordingly there is no danger that debris or heat will cause damage to such a thin layer type SPF or failure thereof, and accordingly the convenience of use and the reliability are enhanced.

In this embodiment, the blazed grooves 133 are formed by laminating a number of Mo/Si pair layers in the range of 100 to 1000 upon the substrate portion 135. Accordingly, as compared with a prior art technique in which 2000 or more Mo/Si pair layers were superimposed, the stress in the composite layer is reduced, so that there is no fear that the composite layer may become detached due to such stress, and accordingly the reliability and the convenience of use are enhanced. Moreover, since the number of layers is reduced, accordingly the manufacturing cost of this EUV collector mirror 130 can also be reduced.

Since, in this embodiment, the EUV collector mirror 130 is endowed with the function of a SPF, accordingly it is possible to provide the exposure device with EUV radiation of high purity which has been subjected to only a single reflection. Therefore it is possible to provide the exposure device with EUV radiation at a higher efficiency than in the case of the prior art, in which the EUV radiation was reflected a plurality of times.

Embodiment 2

A second embodiment of the present invention will now be explained on the basis of FIGS. 5 through 7. The second and third embodiments of the present invention which are described below correspond to variants of the first embodiment described above. Accordingly, the explanation thereof will focus upon the aspects in which these embodiments differ from the first embodiment. The aspects of difference between this second embodiment and the first embodiment are that the blazed grooves are angled in the opposite direction, and that, along with this difference, a dumper 105 is additionally provided.

Figure 5:
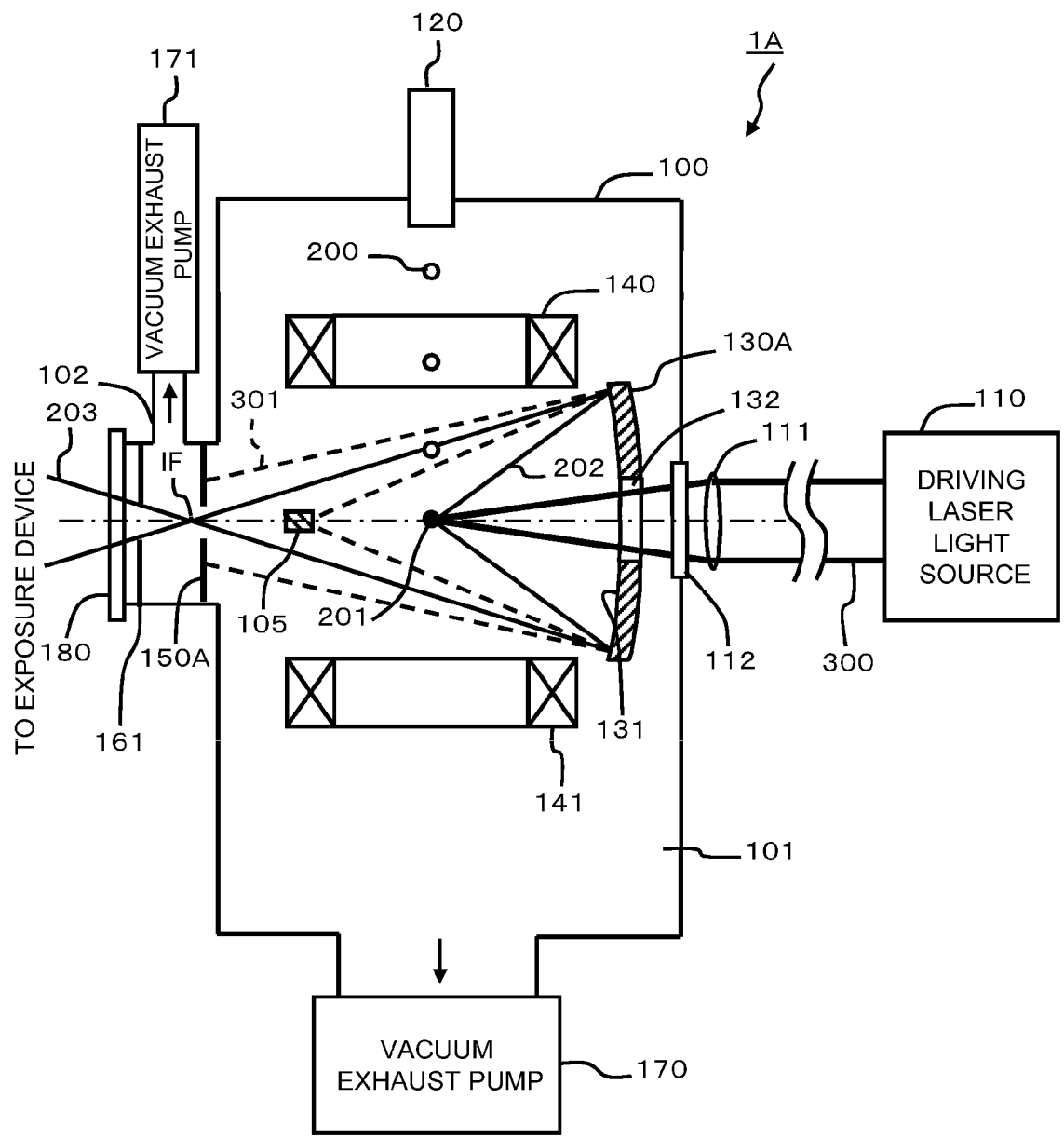
FIG. 5 is an explanatory figure of an EUV light source device according to a second embodiment.

FIG. 5 is an explanatory figure showing the EUV light source device 1A according to this second embodiment. A dumper 105 which is provided at a certain position upon the optical axis AX (refer to FIG. 6) absorbs the regularly reflected radiation 301A which has been deflected by the blazed grooves 133 and converts it to thermal energy. It may also be arranged for this dumper 105 to serve as a dumper for absorbing the laser radiation which is incident into the vacuum chamber 100. It is desirable for the dumper 105 to be cooled by some cooling mechanism such as a water cooling jacket or the like. It should be understood that the SPF shield 150A also serves as a dividing wall aperture.

Figure 6:
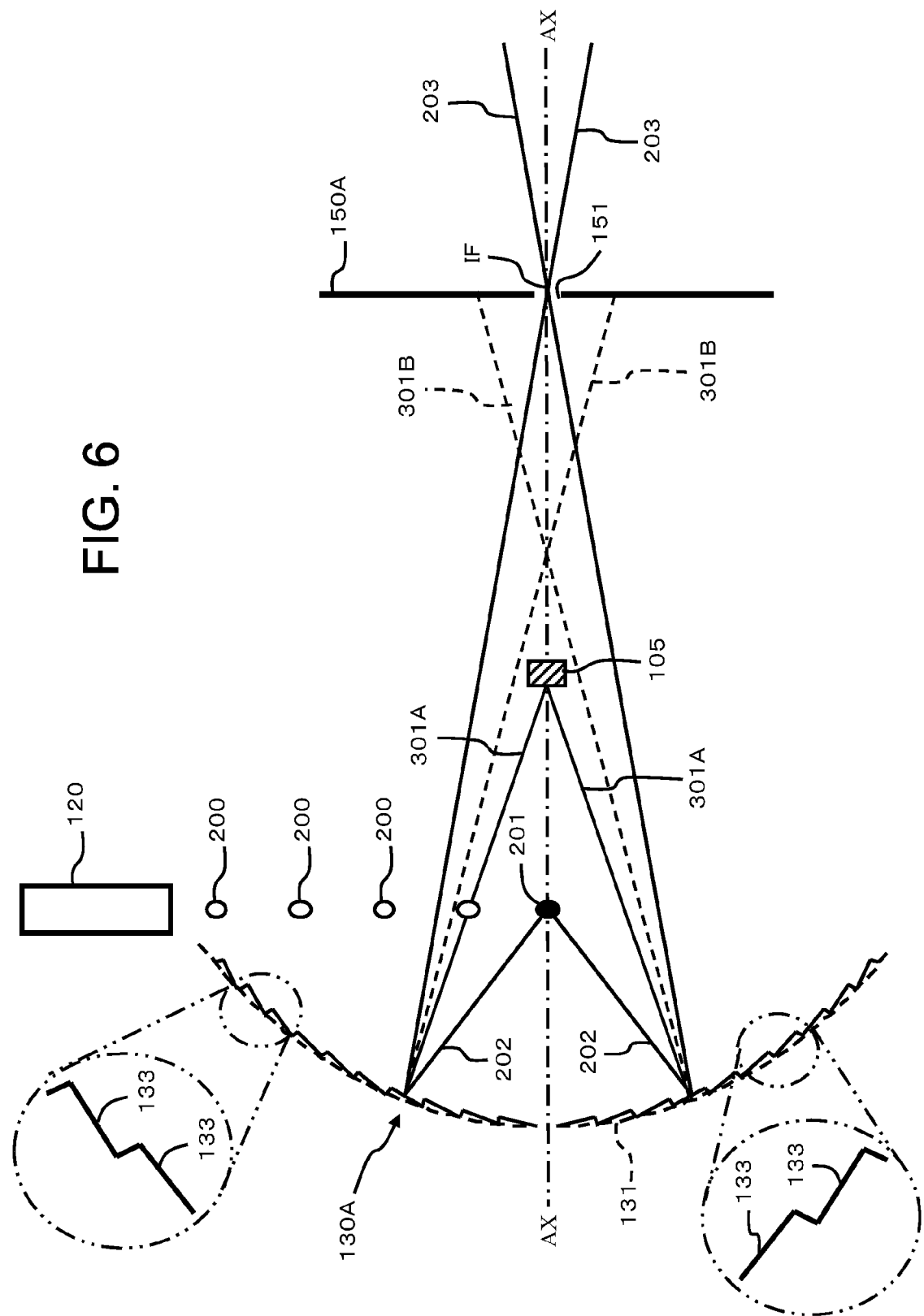
FIG. 6 is an explanatory figure showing a magnified view of an EUV collector mirror in this light source device.

FIG. 6 is an explanatory figure showing the EUV collector mirror 130A and so on in magnified view. As shown in this FIG. 6, the dumper 105 is positioned between the point at which the plasma 201 is generated and the SPF shield 150A, and is provided at a position upon the optical axis at which the reflected radiation 301A is collected together.

As shown in magnified view in FIG. 6, the blazed grooves 133 in this second embodiment are different from the blazed grooves of the first embodiment shown in FIG. 1, in that they are formed so that their abrupt step portions face away from the center of the mirror (the axis AX) towards the outer edge of the mirror. To express this in the opposite manner, each of the blazed grooves 133 is formed so that its sloping portion inclines relatively gently from the outside of the mirror towards the center of the mirror (the axis AX).

Figure 7:
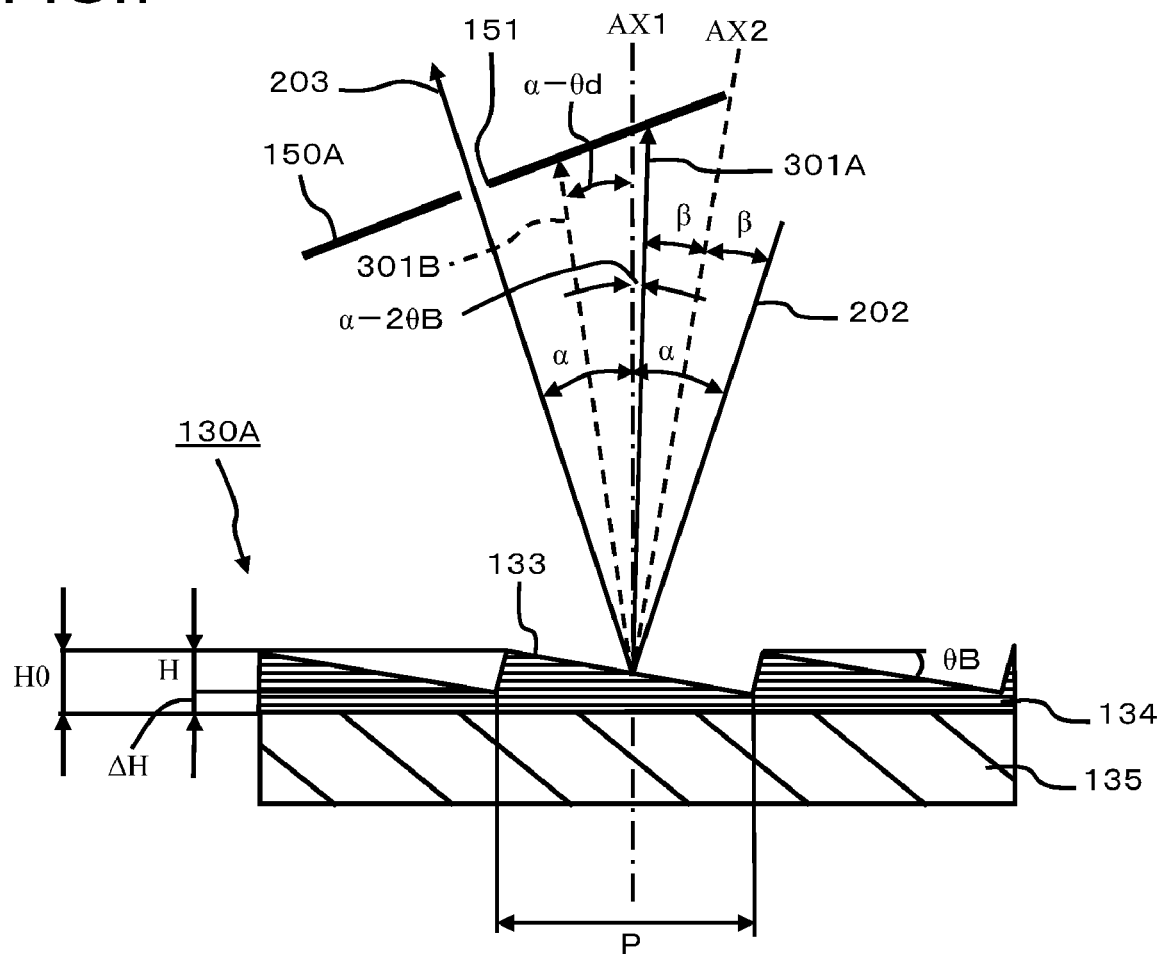
FIG. 7 is a sectional view showing a magnified view of blazed grooves of this EUV collector mirror.

FIG. 7 is an explanatory figure showing a portion of this EUV collector mirror 130A in magnified view. In this embodiment, a total of 850 of the Mo/Si pair layers are laid over one another upon the substrate portion 135. If the thickness of one of these pair layers is taken as being 6.9 nm, then the dimension H0 is 5.865 μm. And, in this embodiment, the blazed grooves 133 are formed at a pitch of 400 μm through the upper 800 layers (so that, in this case, their thickness is 5.520 μm). As a result, the angle θB becomes 13.8 mrad, so that 2θB is 27.6 mrad.

If the mirror surface (131) of the EUV collector mirror 130A is, for example, an elliptical surface whose radius of curvature is 181.8 mm and whose cone constant is −0.67, then the focal point IF is at a distance of about 1 m from this mirror surface. If the angle of incidence of the radiation 202 which is incident upon this EUV collector mirror 130A is termed α, then the DUV, UV, VIS, and IR radiation 301A such as the laser radiation etc. is regularly reflected at the angle α−2θB towards the focal point at which the EUV radiation 203 is reflected at the angle α.

Accordingly, at the position of the focal point IF which is about 1 m from the EUV collector mirror 130A, the EUV radiation 203 and the regularly reflected radiation 301A are separated by a gap of around 27.6 mm. However, in this embodiment, since the regularly reflected radiation 301A is absorbed by the dumper 105 which is provided upon the optical axis AX, accordingly, actually, the EUV radiation and the regularly reflected radiation such as the laser radiation and so on do not even appear together at the position of the focal point IF. The numerical value of 27.6 mm described above is only a hypothetical value which has been calculated provisionally on the assumption that the dumper 105 is not to be provided. In other words, even if the dumper 105 were not to be present, still it would be possible sufficiently to separate the EUV reflected radiation 203 and the other regularly reflected radiation 301A in the vicinity of the focal point IF, and it would still be possible to extract only the EUV radiation by the operation of the SPF shield 150A.

The IR radiation such as the $CO_2$ laser radiation and so on is diffracted at an angle of α−θD by the blazed grooves (which have pitch of 400 μm). In this embodiment Ed is 27.6 mrad, because the wavelength of the $CO_2$ laser is set to be 10.6 μm.

Although for convenience this feature is not shown in the figures, the DUV, UV, and VIS radiation are diffracted by the gratings which are formed by the periodic stripes of silicon and molybdenum appearing on the front surfaces of the blazed grooves 133 (which in this embodiment are at a pitch of 0.5 μm), and proceed onward at angles which are different from that of the EUV radiation 203. Accordingly, by disposing the SPF shield 150A which has the aperture portion of diameter 4 to 6 mm at the position of the focal point IF, it is possible to select only the EUV radiation 203 and to supply it to the exposure device. Thus, with this second embodiment having the above structure, it is possible to obtain similar beneficial effects to those obtained in the case of the first embodiment.

Embodiment 3

A third embodiment of the present invention will now be explained on the basis of FIGS. 8 and 9. In this third embodiment, the blazed grooves are formed in a somewhat different manner. FIG. 8 is a figure showing the EUV collector mirror 130 as seen from the front. The blazed grooves 133 may be formed as concentric circles, as shown in FIG. 8(a), or may be formed as parallel straight lines, as shown in FIG. 8(b).

Figure 9:
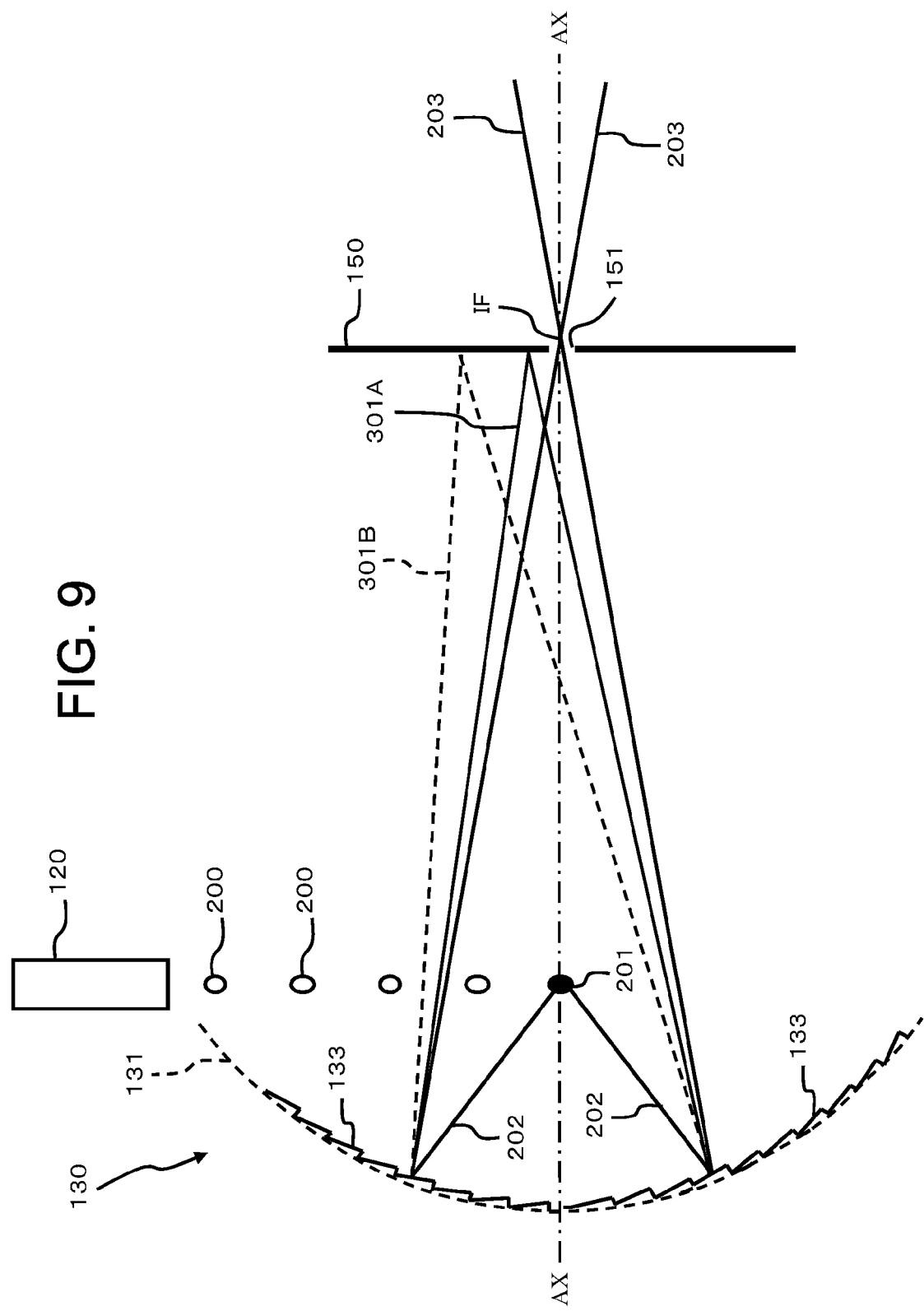
FIG. 9 is an explanatory figure showing a situation in which blazed grooves shaped as straight lines are formed across the entire surface of a mirror.

If the blazed grooves 133 are formed as parallel straight lines as shown in FIG. 8(b), then it would also be possible, as shown in FIG. 9, to form the blazed grooves to extend in the same direction across the entire surface of the EUV collector mirror 130. Thus, with this third embodiment having the above structure, it is possible to obtain similar beneficial effects to those obtained in the case of the first embodiment.

Embodiment 4

Figure 10:
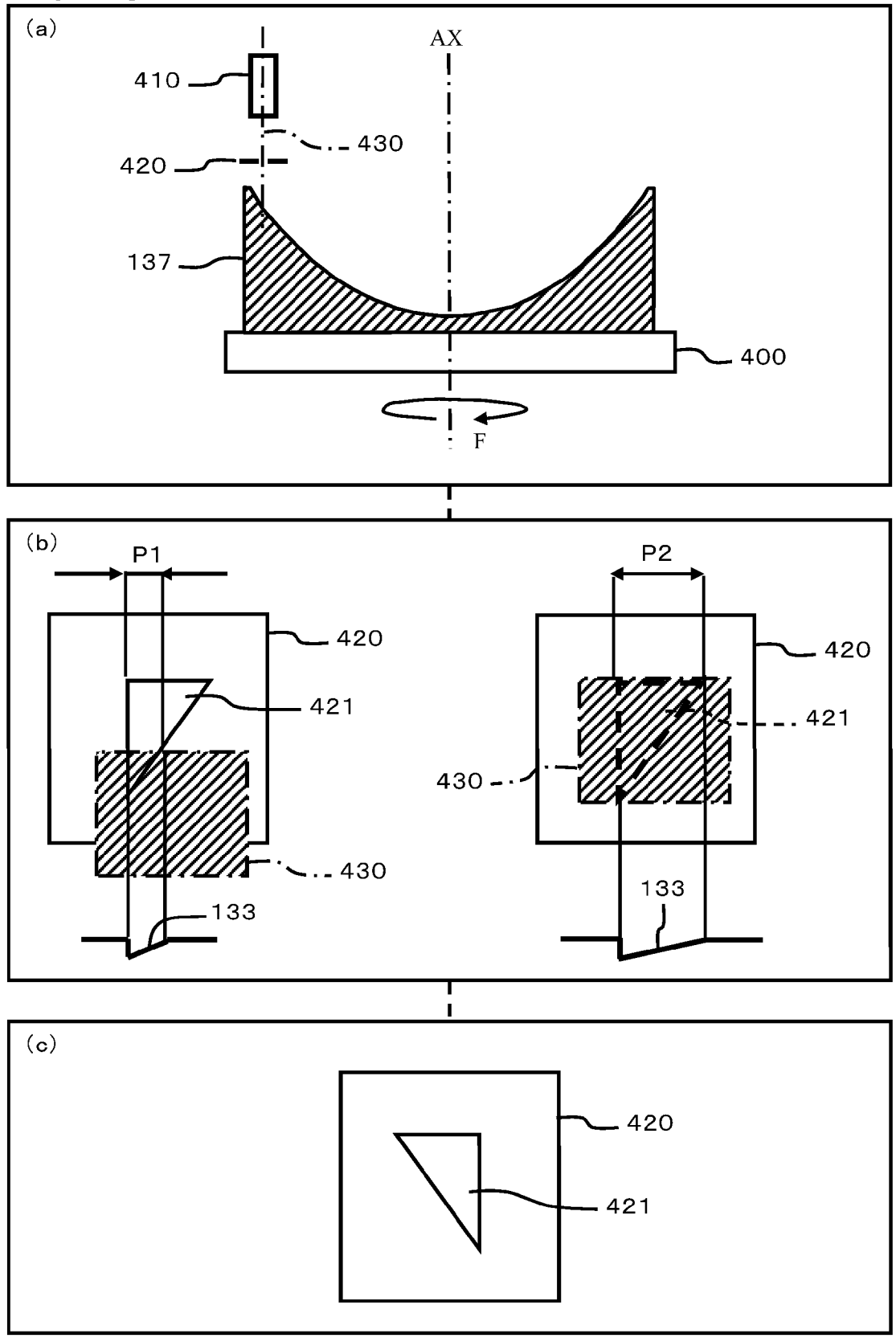
FIG. 10 is an explanatory figure showing a method of manufacturing an EUV collector mirror according to a fourth embodiment of the present invention.

In the following, several examples of manufacturing methods for an EUV collector mirror 130 of the novel type described above which is endowed with the function of operating as an SPF will be explained. A fourth embodiment of the present invention, which relates to its aspect of providing a method for manufacturing such a mirror for extreme ultra violet, will now be explained on the basis of FIG. 10.

As shown in FIG. 10(a), a mirror member 137 which is made by coating a predetermined number of multi layers upon a substrate portion 135 is loaded upon a rotational stage 400 and is rotated. And a cutting process for forming blazed grooves is performed by irradiating an ion beam 430 upon these multi layers, using an ion milling device 410 and a mask 420.

And, as shown in FIG. 10(b), a pattern 421 shaped as a right angled triangle, and through which the ion beam 430 passes, is formed in the mask 420. Accordingly, the width P1 or P2 of the blazed grooves can be adjusted by changing the relative positional relationship between the pattern 421 and the ion beam 430.

As shown on the left side of FIG. 10(b), when the area of overlap between the triangular shaped pattern 421 and the ion beam 430 is small, it is possible to form narrow blazed grooves 133 of width P1 as shown at the lower portion of this figure. On the other hand, as shown on the right side of FIG. 10(b), when the ion beam 430 is overlapped over the entire surface of the triangular shaped pattern 421, it is possible to form broad blazed grooves of width P2.

Each time the formation of one blazed groove has been completed, the ion milling device 410 and the mask 420 are shifted in the radial direction (the horizontal direction in FIG. 10) by just the desired pitch for the grooves, and then the ion beam is again irradiated and a new blazed groove is formed.

If blazed grooves like those shown in FIG. 3 are to be formed, then, as shown in FIG. 10(c), a mask 420 is used in which the orientation of the triangular shaped pattern 420 is changed. Thus, with this embodiment of the present invention having the structure described above, it is possible to manufacture the EUV collector mirrors 130 described above according to both the first and the second embodiments, in a simple and easy manner.

Embodiment 5

Figure 11:
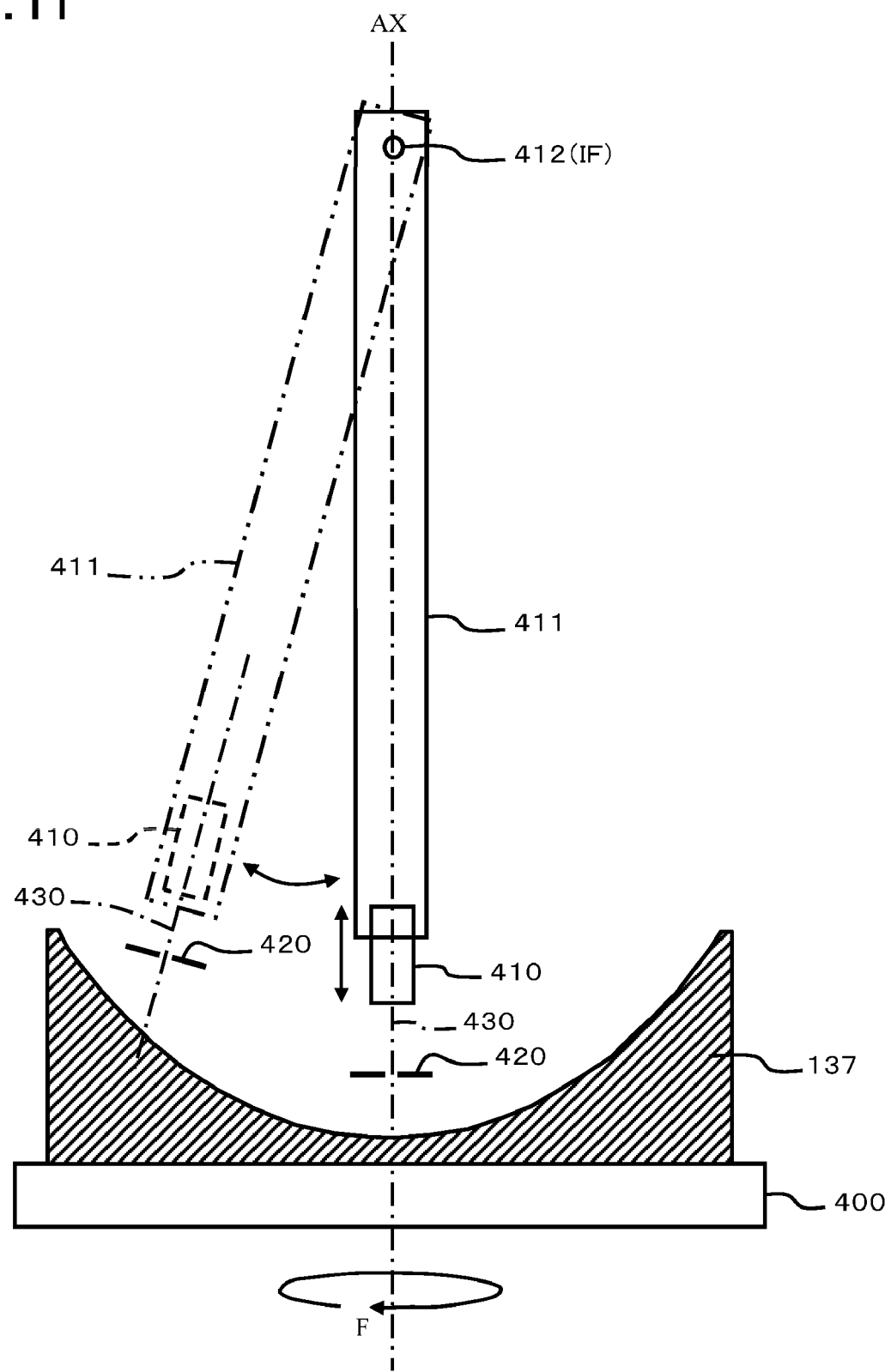
FIG. 11 is an explanatory figure showing a method of manufacturing an EUV collector mirror according to a fifth embodiment.

A fifth embodiment will now be explained on the basis of FIG. 11. In this fifth embodiment, as well as the mirror stage 400 and the mirror being rotated, the ion milling device 410 and the mask 420 are swung around a rotational axis 412 which is positioned to correspond to where the intermediate focal point IF at which the EUV radiation is to be gathered together is to be formed.

The ion milling device 410 and the mask 420 are fitted to a long tubular support device 411 so as to be shiftable along its axial direction. This support device 411 is rotatable in the left and right directions in FIG. 11 about the rotational axis 412 (which passes through the focal point IF) as a center. The rotational axis 412 (i.e. the focal point IF) is set to a distance which is separated from the center of the mirror surface of the mirror member 137 (i.e. from where the center of the mirror surface will be when it is completed) by just the distance desired for the focal point IF. Then the blazed grooves are formed while swinging the ion milling device 410 and the mask 420 axially in the sideways direction in the figure.

Since the rotational axis 412 (i.e. the focal point IF) is set to the same position with respect to the EUV collector mirror 130 as the position at which the final focal point IF will be located, accordingly the ion beam is irradiated from the ion milling device 410 in the opposite orientation to the radiation beam 203 in FIG. 1. Due to this, it is possible to keep the angle at which the ion beam is incident upon the composite layer constant, and thus it is possible to process the blazed grooves in a constant shape. This means that it is possible to prevent shadow areas occurring upon the EUV collector mirror 130, in which the EUV radiation which is emitted from the plasma 201 is hindered by the edges of the blazed grooves and cannot be properly incident.

Embodiment 6

A sixth embodiment will now be explained on the basis of FIG. 12. In this sixth embodiment, as shown in FIG. 12(a), the position of the rotational axis 412 (201) is set to the point at which the plasma 201 originates. Moreover, as shown in FIG. 12(b), a mask 420A is used whose length corresponds to the radius of the EUV collector mirror 130, and a pattern 421 consisting of a plurality of right angled triangles is provided upon this long mask 420A corresponding to each of the blazed grooves which are to be formed. Accordingly, it is possible to form the blazed grooves by simply irradiating the ion beam while swinging the ion milling device 410 in the diametrical direction and while rotating the mirror 130, without any necessity for shifting the mask 420A.

With this fifth embodiment of the present invention having the structure described above, it is again possible to prevent the occurrence of so called shadow portions such as described above, and it is thus possible to provide an EUV collector mirror 130 which collects and separates out the EUV radiation with good efficiency.

Embodiment 7

Figure 13:
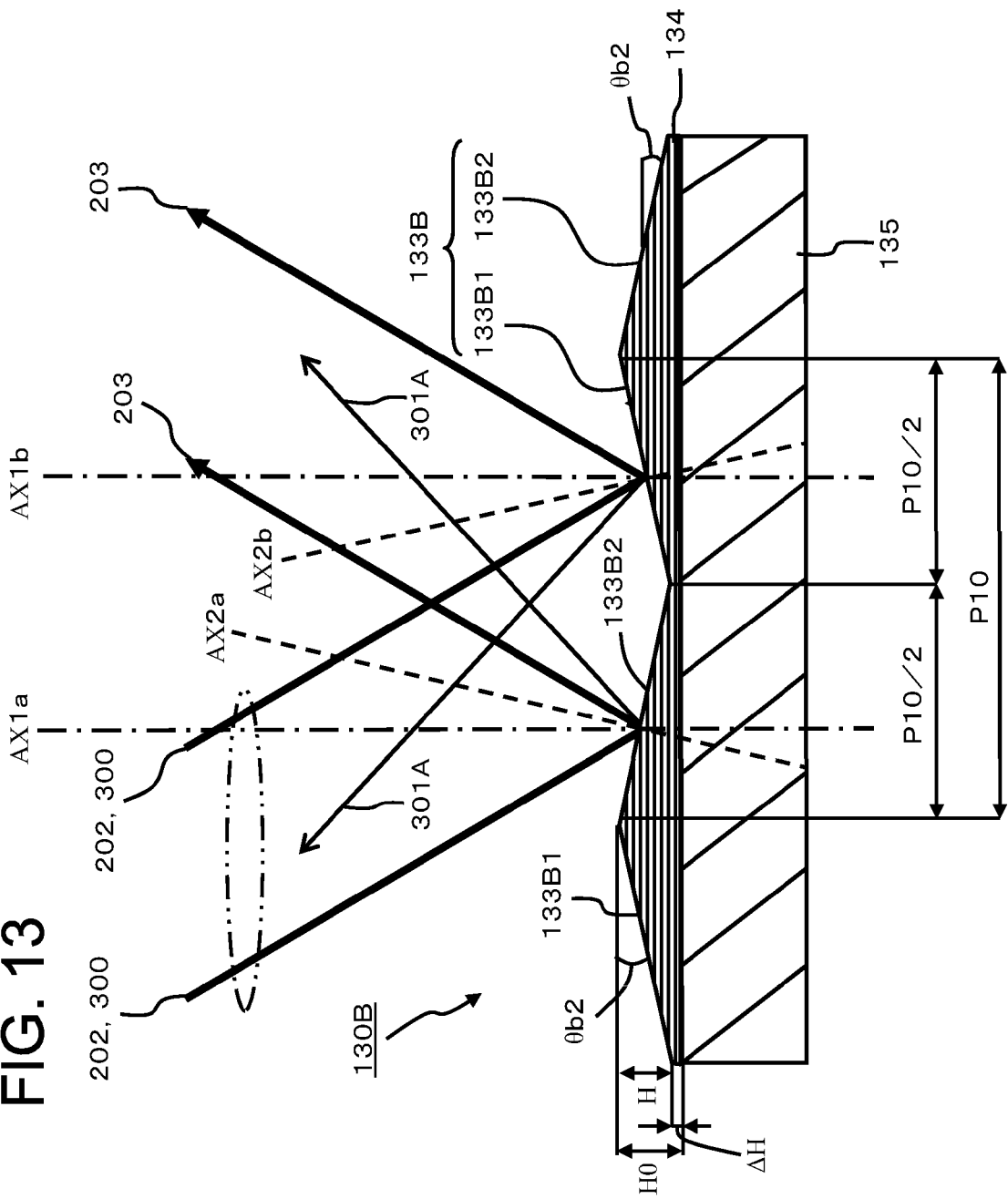
FIG. 13 is a sectional view showing a magnified view of an EUV collector mirror according to a seventh embodiment.

A seventh embodiment of the present invention will now be explained on the basis of FIGS. 13 through 15. The EUV collector mirror 130B of this seventh embodiment instead of blazed grooves, triangular roof-like grooves 133B are provided. And, in this EUV collector mirror 130B of this seventh embodiment, these triangular roof-like grooves 133B are, again, formed integrally in a composite layer which covers the front surface of the substrate portion 135. In a similar manner to the procedure for the first embodiment, for example, 300 pair layers of Mo/Si are layered together into a composite layer on the substrate portion 135, and then the triangular roof-like grooves or triangular roof shapes are formed in the uppermost 250 of these 300 pair layers, from the front surface inwards. In FIG. 13, the axial lines AX1a and AX1b are perpendiculars to the substrate portion 135, while the other axial lines AX2a and AX2b are axes which are perpendicular to the sloping roof-shaped surfaces of the triangular roof-like grooves 133B.

Each of these triangular roof-like grooves 133B has two sloping surfaces 133B1 and 133B2. The tilt angles θb2 of these two sloping surfaces 133B1 and 133B2 may be set to be the same. Here, for convenience of explanation, the sloping surfaces on the left side in FIG. 13 will be termed the first sloping surfaces 133B1, while the sloping surfaces on the right side in FIG. 13 will be termed the second sloping surfaces 133B2.

The triangular roof-like grooves 133B, for example, may be formed at a pitch P10 of around 800 µm. In this case, the first sloping surfaces 133B1 and the second sloping surfaces are defined alternatingly at intervals of 400 µm (which =P10/2) in the direction parallel to the substrate portion 135. To put this in another manner, with the EUV collector mirror 130B of this embodiment, the orientations of the sloping surfaces 133B1 and 133B2 change to and fro in opposite senses at this pitch P10/2.

According to the inclinations of the sloping surfaces 133B1 and 133B2, the radiation other than the EUV radiation (i.e. the driver laser radiation, and DUV, UV, VIS, and IR) is regularly reflected by these sloping surfaces, and in directed in directions which are different from that of the reflected EUV radiation 203. The EUV radiation is Bragg diffracted by the foundation portion 135 and by the 10 to 50 Mo/Si pair layers which are laid thereupon underneath the portion in which the triangular roof-like grooves 133B are formed. The efficiency of this diffraction is the same as that of a mirror upon which Mo/Si pair layers are provided.

Furthermore, due to the triangular roof-like grating structure having a period of 800 µm which is defined, the VIS and IR radiation described above are diffracted in directions which are different from that of the EUV radiation. Moreover, due to the gratings which are defined by the periodic stripe patterns of the Mo/Si pair layers which are exposed upon the sloping surfaces 133B1 and 133B2, the radiation of comparatively short wavelengths other than the EUV radiation and the IR radiation (i.e. the DUV, UV, and VIS) is diffracted in directions which are different from that of the reflected EUV radiation 202.

It would also be acceptable to arrange to set the value of the pitch P10 to some other value such as 400 µm or the like, instead of to 800 µm. For example, if the pitch P10 is set to 400 µm, then it is possible to obtain optical diffraction operation as a grating of pitch 400 µm, in a similar manner to the case with the first embodiment. By contrast, if the pitch P10 is set to 800 µm, then it is possible to obtain optical diffraction operation as a grating of pitch 800 µm. Furthermore, it is not necessary to keep the pitch constant; it would also be acceptable to change the pitch according to the position in which the triangular roof-like grooves 133B are formed. Moreover, it would also be possible to set the pitch of the sloping surfaces 133B1 and the pitch of the sloping surfaces 133B2 to be different: for example, the pitch of the sloping surfaces 133B1 might be set to 300 µm and the pitch of the sloping surfaces 133B2 might be set to 500 µm.

Figure 14:
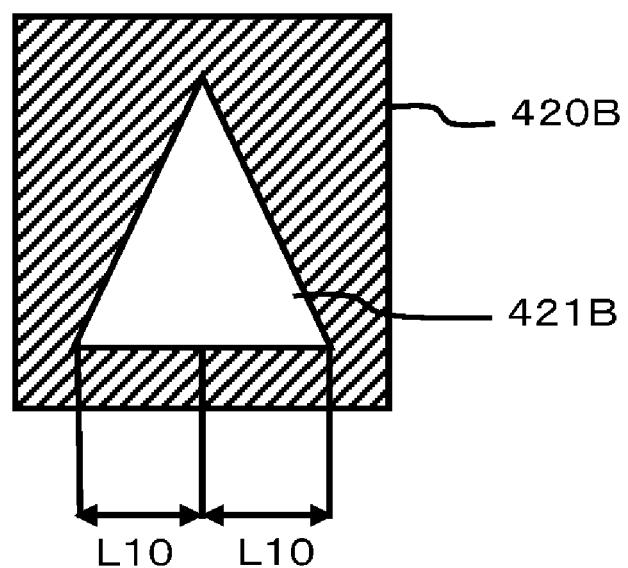
FIG. 14 is an explanatory figure showing a mask which can be used for making this EUV collector mirror.

FIG. 14 is a plan view of a mask 420B for forming the triangular roof-like grooves 133B according to this seventh embodiment. When forming these triangular roof-like grooves by employing the process according to the fourth embodiment described above, this mask 420B shown in FIG. 14 is used. The mask 420B has a triangular shaped aperture pattern 421B which corresponds to the triangular roof-like grooves 133B.

Figure 15:
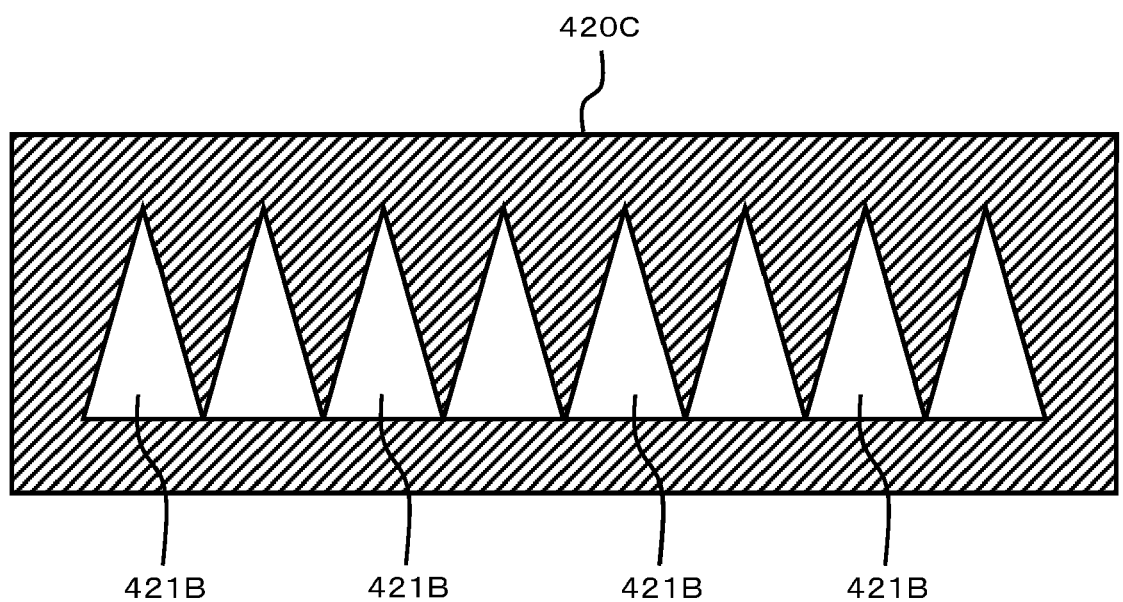
FIG. 15 is an explanatory figure showing another mask which can be used for making this EUV collector mirror.

FIG. 15 is a plan view showing another mask 420C for forming the triangle roof-like grooves 133B according to this embodiment. When forming these triangular roof-like grooves by employing the process according to the sixth embodiment described above, such a mask 420C is used which has a length which corresponds to the radius of the EUV collector mirror 130B, as shown in FIG. 15. Aperture patterns 421B shaped as triangles are provided in this mask 420C so as to correspond to each of the triangular roof-like grooves 133B. Thus, with this seventh embodiment having the above structure, it is possible to obtain similar beneficial effects to those obtained in the case of the first embodiment.

Embodiment 8

Figure 16:
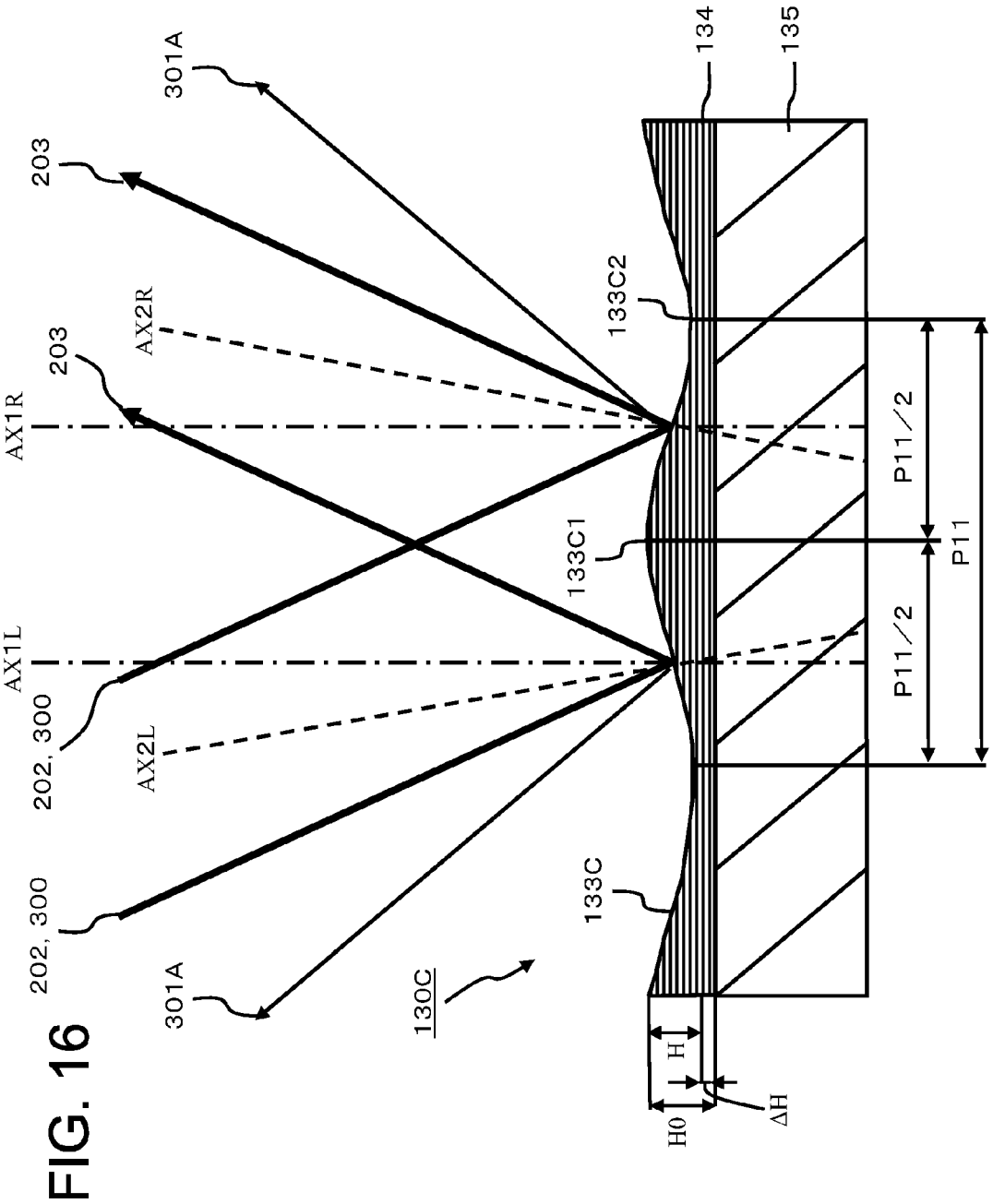
FIG. 16 is a sectional view showing a magnified view of an EUV collector mirror according to an eighth embodiment.
Figure 17:
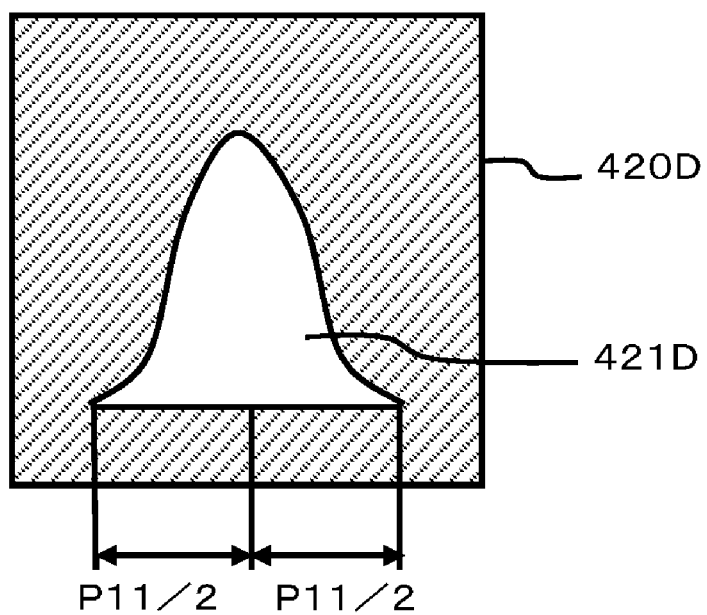
FIG. 17 is an explanatory figure showing a mask which can be used for making this EUV collector mirror.

An eighth embodiment will now be explained on the basis of FIGS. 16 through 18. The EUV collector mirror 130C of this eighth embodiment is formed with relatively smooth undulating wave-like grooves 133C. The wave-like shape of these grooves 133C may, for example, be, at least approximately, a sinusoidal shape. In this embodiment as well, for example, 300 Mo/Si pair layers are laminated upon the foundation 135 as a composite layer, and then the wave-like grooves 133C are formed in the uppermost 250 of these pair layers, from the front surface. In FIG. 16, the axial lines AX1L and AX1R are lines which are perpendicular to the substrate portion 135, while the other axial lines AX2L and AX2R are lines which are perpendicular to the arcuate surfaces at their steepest points. The reference symbol 133C1 denotes a summit of one of the wave-like shapes, while the reference symbol 133C2 denotes a valley thereof.

With the EUV collector mirror 130C according to this embodiment, the inclination of the surface changes relatively smoothly in a sinusoidal fashion repeatedly at the pitch P10 (which may be, for example, 600 µm). According to the inclinations of the arcuate surfaces, the radiation other than the EUV radiation (i.e. the driver laser radiation, and the DUV, UV, VIS, and IR) is reflected in a direction which is different from that of the reflected EUV radiation 203.

However at places when these inclination are nearly horizontal, as at the summit 133C1, the EUV radiation and the radiation other than the EUV radiation (i.e. the driver laser radiation, and the DUV, UV, VIS, and IR) are all regularly reflected in approximately the same direction.

As described above, the EUV radiation is Bragg diffracted by the foundation portion 135 and by the 10 to 50 Mo/Si pair layers which lie underneath the portion in which the wave-like grooves 133C are formed. The efficiency of this diffraction is the same as that of a mirror upon which Mo/Si pair layers are provided. Furthermore, due to the wave-like grating structure having, for example, a period of 600 µm, the VIS and IR radiation are diffracted in directions which are different from that of the EUV radiation. Moreover, due to the grating which is defined by the periodic stripe pattern of the Mo/Si pair layers which are exposed upon the arcuate surfaces, the radiation of comparatively short wavelengths other than the EUV radiation and the IR radiation (i.e. the DUV, UV, and VIS) is diffracted in directions which are different from that of the reflected EUV radiation 202. FIG. 17 is a plan view showing a mask 420D for forming these wave-like grooves 133C of this eighth embodiment. When forming the wave-like grooves 133C according to this eighth embodiment with the process according to the fourth embodiment described above, this mask shown in FIG. 17 is used. This mask 420D has a wave-like pattern 421D which corresponds to the desired pattern for the wave-like grooves 133C.

Figure 18:
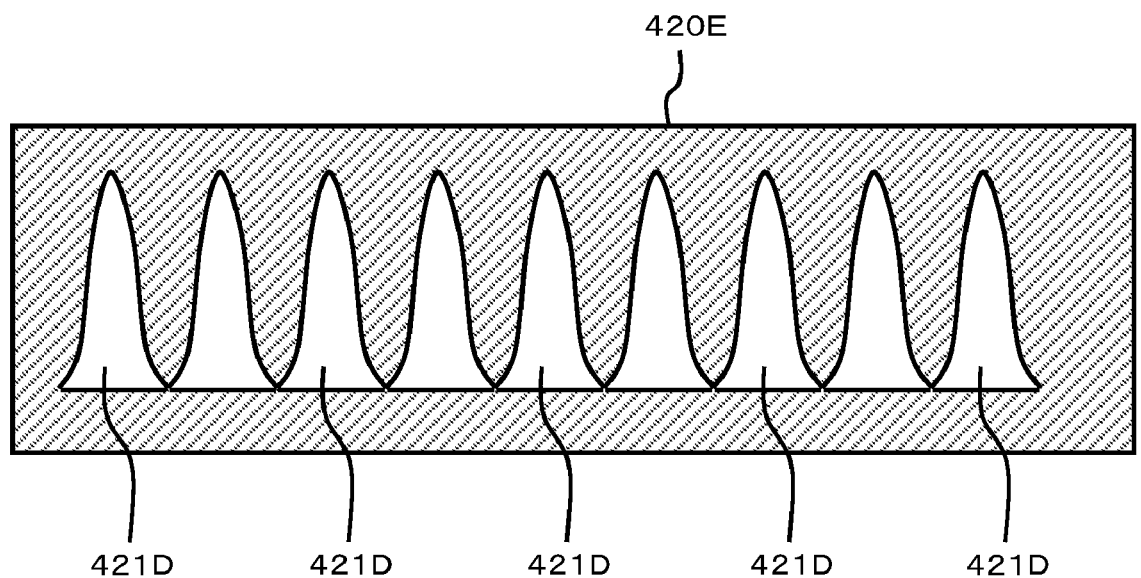
FIG. 18 is an explanatory figure showing another mask which can be used for making this EUV collector mirror.

FIG. 18 is a plan view showing another mask 420E for forming the wave-like grooves 133C of this eighth embodiment. When forming the wave-like grooves 133C according to this eighth embodiment with the process according to the sixth embodiment described above, as shown in FIG. 18, a mask 420E is used which has a length corresponding to the radius of the EUV collector mirror 130C. Wave-like aperture patterns 421D are provided in this mask 420E to correspond to each of the wave-like grooves 133C. It should be noted that, when using an EUV collector mirror 130 in which grooves, having shapes as shown in the seventh and eighth embodiments, are arranged in concentric circles as shown in FIG. 8(a), it is desirable for a dumper 105 and a SPF shield 150A as shown in FIG. 6 to be used, in order to intercept radiation other than the EUV radiation.

It should be understood that the present invention is not limited to the embodiments described above. On the basis of the disclosure herein, a person of ordinary skill in the art would be able to make various additions and/or changes and so on to the details of any particular embodiment, within the scope of the present invention. For example, in order to obtain the desired effect in which the mirror also acts as an SPF, it would also be acceptable to make the shape of the mirror on its substrate as planar; and it is not necessary to keep the pitch P of the grooves at a constant value; this pitch P could be varied. Moreover, this collector mirror for extreme ultra violet is not limited to being used with an LPP type light source; it would also be possible to use, for example, a DPP light source with a collector mirror of this type.

Or, it would also be possible to install this mirror for extreme ultra violet within the exposure device, as a reflecting mirror which is also endowed with the function of acting as an SPF. In this case, such a reflecting mirror for extreme ultra violet according to the present invention may be structured as a planar mirror, a concave surface mirror, a parabolic mirror, an ellipsoid of revolution, or the like. Such a mirror for extreme ultra violet according to the present invention may, for example, be installed as a portion of the optical system within the exposure device, and may be used for directing the component consisting of extreme ultra violet of high purity in some predetermined direction. It should be understood that the present invention is not limited to application to a extreme ultra violet light source or to an exposure device (i.e. to EUV lithography); it could also be used for various other applications in which extreme ultra violet is to be reflected and/or focused.

The invention claimed is:

1. An EUV (Extreme Ultraviolet) collector mirror for an EUV light source, the EUV light source being configured for irradiating a target with laser light from a driver laser to turn the target into plasma, the EUV collector mirror comprising a multilayered reflecting surface with grooves and being configured for collecting EUV light from the plasma to a focal spot, the grooves being arranged in a concentric fashion, wherein the grooves are configured for diffracting at least light at a wavelength which is the same as that of the laser light from the driver laser.

2. The EUV collector mirror according to claim 1, wherein a wavelength of light to be diffracted by the grooves is approximately 10.6 μm.

3. The EUV collector mirror according to claim 1, wherein the driver laser is a carbon dioxide ($CO_2$) laser.

4. The EUV collector mirror according to claim 1, wherein the EUV collector mirror has a first focus and a second focus.

5. The EUV collector mirror according to claim 4, wherein the grooves are arranged concentrically with respect to an axis going through the first focus and the second focus.

6. The EUV collector mirror according to claim 1, wherein the EUV collector mirror is one of an ellipsoidal mirror and a paraboloidal mirror.

7. The EUV collector mirror according to claim 6, wherein the grooves are arranged concentrically with respect to an axis of symmetry of the multilayered reflecting surface of the one of the ellipsoidal mirror and the paraboloidal mirror.

8. The EUV collector mirror according to claim 1, wherein a distance between a nadir of one groove and that of an adjacent groove is in a range of 300 μm to 800 μm.

9. The EUV collector mirror according to claim 1, wherein a distance between a nadir of one groove and that of an adjacent groove is in a range of 1.54 μm to 400 μm.

10. The EUV collector mirror according to claim 1, wherein a distance between a nadir of one groove and that of an adjacent groove is in a range of 400 μm to 800 μm.

11. The EUV collector mirror according to claim 1, wherein a distance between a nadir of one groove and that of an adjacent groove is in a range of 1.54 μm to 800 μm.

12. The EUV collector mirror according to claim 1, wherein the multilayered reflecting coating comprises 100 to 1000 pairs of stacked Mo/Si layers.

13. The EUV collector mirror according to claim 1, wherein
the multilayered reflecting surface comprises pairs of stacked Mo/Si layers, and
a nadir of each groove reaches approximately 250 th to 300 th pair of the stacked Mo/Si layers from a surface of the one of the mirrors.

14. The EUV collector mirror according to claim 13, further comprising a substrate with the multilayered reflecting surface, wherein
the multilayered reflecting surface includes approximately 50 pairs of the stacked Mo/Si layers between the nadir and the substrate.

15. The EUV collector mirror according to claim 1, further comprising a surface coating on a surface of the multilayered reflecting surface.

16. The EUV collector mirror according to claim 15, wherein a material of the surface coating includes ruthenium.

17. A method for manufacturing an EUV collector mirror according to claim 1, the method comprising the step of irradiating the multilayered reflecting surface with a particle beam through a mask to form the grooves configured for diffracting light at a wavelength different from that of the EUV light.

18. The method according to claim 17, wherein the particle beam is an ion beam.

19. The method according to claim 17, wherein the irradiating step includes rotating the EUV collector mirror about an axis of symmetry of the EUV collector mirror when irradiating the multilayered reflecting surface with the particle beam.

20. The method according to claim 19, wherein the irradiating step further comprises the steps of:
irradiating the multilayered reflecting surface with the particle beam delivered in a first direction to form a first groove;
changing an irradiation direction of the particle beam to a second direction from the first direction; and
irradiating the multilayered reflecting surface with the particle beam delivered in the second direction to form a second groove.

21. The method according to claim 19, wherein the first and second directions are substantially perpendicular to the multilayered reflecting surface to which the particle beam is delivered.

22. The EUV collector mirror according to claim 1, wherein the grooves are configured for diffracting light to be reflected or scattered by the target.

23. The EUV collector mirror according to claim 1, wherein the grooves are configured for diffracting the laser light to be reflected or scattered by the target.

24. The EUV collector mirror according to claim 1, wherein the grooves are configured for diffracting the laser light to be reflected or scattered by the target to focus the reflected or scattered laser light on a position.

25. The EUV collector mirror according to claim 1, wherein the grooves are configured for diffracting the laser light to be reflected or scattered by the target to focus the reflected or scattered laser light on a position where no focal spot on which the EUV light is focused is placed.

26. The EUV collector mirror according to claim 1, wherein pitches of the grooves are varied in accordance with locations on the multilayered reflecting surface.

27. An EUV light source for generating an EUV light for an exposure device, the EUV light source being configured for irradiating a target with laser light from a driver laser to turn the target into plasma from which the EUV light is emitted, the EUV light source comprising:
  a chamber;
  a target supply device configured for supplying the target into the chamber; and
  an EUV collector mirror in the chamber, the EUV collector mirror comprising a multilayered reflecting surface with grooves and being configured for collecting the EUV light from the plasma to a focal spot, the grooves being arranged in a concentric fashion, wherein
  the grooves are configured for diffracting at least light at a wavelength which is the same as that of the laser light from the driver laser.

28. The EUV light source according to claim 27, wherein a wavelength of light to be diffracted by the grooves is approximately 10.6 µm.

29. The EUV light source according to claim 27, wherein the driver laser is a carbon dioxide ($CO_2$) laser.

30. The EUV light source according to claim 27, further comprising a magnetic field generator for generating a magnetic field around the plasma.

31. The EUV light source according to claim 30, wherein the magnetic field generator comprises a plurality of coils for generating the magnetic field.

32. The EUV light source according to claim 27, wherein the target supply device is configured for providing the target to the chamber in the form of droplets.

33. The EUV light source according to claim 32, wherein a material for the target is Sn.

34. The EUV light source according to claim 27, wherein the chamber contains at least one of a hydrogen gas, a halogen gas, a hydrogenated halogen gas, and an argon gas.

35. The EUV light source according to claim 34, further comprising a heater for heating the EUV collector mirror.

36. The EUV light source according to claim 34, further comprising a radio wave generator configured for generating a radio wave to excite the at least one of the hydrogen gas, the halogen gas, the hydrogenated halogen gas, and the argon gas in the chamber.

37. The EUV light source according to claim 27, further comprising a light shielding device placed between the EUV collector mirror and the exposure device, and configured for passing light to be collected to the focal spot by the EUV collecting mirror.

38. The EUV light source according to claim 37, wherein the light shielding device is placed between a region where the target is turned into the plasma and the exposure device.

39. The EUV light source according to claim 37, wherein the light shielding device includes a cooling device for cooling the light shielding device.

40. The EUV light source according to claim 37, wherein the light shielding device includes a through-hole through which the light to be collected to the focal spot passes.

41. The EUV light source according to claim 40, wherein the through-hole of the light shielding device has a diameter equal to or less than around 10 mm.

42. The EUV light source according to claim 40, wherein the through-hole of the light shielding device has a diameter in a range of 4 mm to 6 mm.

43. The EUV light source according to claim 27, wherein the EUV collector mirror has a first focus and a second focus.

44. The EUV light source according to claim 43, wherein the grooves are arranged concentrically with respect to an axis going through the first focus and the second focus.

45. The EUV light source according to claim 27, wherein the EUV collector mirror is one of an ellipsoidal mirror and a paraboloidal mirror.

46. The EUV light source according to claim 45, wherein the grooves are arranged concentrically with respect to an axis of symmetry of the multilayered reflecting surface of the one of the ellipsoidal mirror and the paraboloidal mirror.

47. The EUV light source according to claim 27, wherein a distance between a nadir of one groove and that of an adjacent groove is in a range of 300 µm to 800 µm.

48. The EUV light source according to claim 27, further comprising a surface coating on a surface of the multilayered reflecting surface.

49. The EUV light source according to claim 48, wherein a material of the surface coating includes ruthenium.

50. The EUV light source according to claim 27, wherein the EUV collector mirror is positioned to first reflect the EUV light from the plasma.

51. The EUV light source according to claim 27, wherein the EUV collector mirror is positioned so that the EUV light from the plasma is directly incident on the EUV collector mirror.

52. An EUV (Extreme Ultraviolet) collector mirror for an EUV light source, the EUV light source being configured for irradiating a target with laser light from a driver laser to turn the target into plasma, the EUV collector mirror comprising a multilayered reflecting surface with grooves and being configured for collecting EUV light from the plasma to a focal spot, the grooves being arranged in a concentric fashion, wherein
  the EUV collector mirror is an ellipsoidal mirror.

53. The EUV collector mirror according to claim 52, wherein the EUV collector mirror has a first focus and a second focus, and is configured for focusing on around the second focus the EUV light from the plasma to be generated around the first focus.

54. The EUV collector mirror according to claim 53, wherein the grooves are configured for diffracting at least light at a wavelength which is the same as that of the laser light from the driver laser, the diffracted light being focused on a position where no focal spot on which the EUV light is focused is placed.

55. The EUV collector mirror according to claim 52, wherein the multilayered reflecting surface is configured for focusing the EUV light on the focal spot by Bragg reflection.

* * * * *